(12) United States Patent
Tavakoli et al.

(10) Patent No.: US 12,707,565 B2
(45) Date of Patent: Aug. 11, 2026

(54) FLEXIBLE PRINTED CIRCUIT, INK AND METHOD FOR OBTAINING FLEXIBLE PRINTED CIRCUIT THEREOF

(71) Applicant: Universidade de Coimbra, Coimbra (PT)

(72) Inventors: Mahmoud Tavakoli, Coimbra (PT); Aníbal Traça De Almeida, Coimbra (PT); Pedro Filipe Alhais Lopes, Coimbra (PT); Bruno Alexandre Coutinho Dos Santos, Braga (PT)

(73) Assignee: UNIVERSIDADE DE COIMBRA, Coimbra (PT)

( * ) Notice: Subject to any disclaimer, the term of this patent is extended or adjusted under 35 U.S.C. 154(b) by 413 days.

(21) Appl. No.: 18/547,852

(22) PCT Filed: Feb. 24, 2022

(86) PCT No.: PCT/IB2022/051654
§ 371 (c)(1),
(2) Date: Aug. 24, 2023

(87) PCT Pub. No.: WO2022/180577
PCT Pub. Date: Sep. 1, 2022

(65) Prior Publication Data

US 2024/0147618 A1 May 2, 2024

(30) Foreign Application Priority Data

Feb. 24, 2021 (PT) ........................................ 117082

(51) Int. Cl.
*H05K 1/02* (2006.01)
*H05K 1/03* (2006.01)
(Continued)

(52) U.S. Cl.
CPC ........... *H05K 1/095* (2013.01); *H05K 1/0283* (2013.01); *H05K 1/0353* (2013.01); *H05K 2203/02* (2013.01)

(58) Field of Classification Search
CPC ...... H05K 1/095; H05K 1/0283; H05K 1/186; H05K 3/1283; H05K 3/1216; H05K 3/1241; H05K 3/225
See application file for complete search history.

(56) References Cited

U.S. PATENT DOCUMENTS 10,483,493 B2 11/2019 Sargent et al.
2015/0076670 A1 3/2015 Pan et al.
(Continued)

FOREIGN PATENT DOCUMENTS

CN 108538864 A 9/2018
CN 111849250 A * 10/2020 ........... H05K 1/0283
(Continued)

OTHER PUBLICATIONS

Daniel Green Marques et al., "Reliable interfaces for EGaIn multi-layer stretchable circuits and microelectronics", Lab Chip, Jan. 2019, pp. 897-906.
(Continued)

*Primary Examiner* — Amol H Patel
(74) *Attorney, Agent, or Firm* — Leason Ellis LLP

(57) ABSTRACT

A method for obtaining a flexible circuit with an solid-state electric or electronic component, the method comprising: arranging an electric circuit with a conductive flexible polymer-based ink over a polymeric substrate in the solid state, wherein one or both polymers in the ink and the substrate are reversible solid-gel phase transition polymers; placing the component over the substrate and over the electric circuit; applying an external stimulus that results in a solid to gel transition of the polymeric substrate and ink,
(Continued)

Solid-Gel Transition→ penetrating into the ink

Ink and component penetrate the substrate

Cross Section showing the ink encapsulation such that the component penetrates into the softened substrate, establishing an electrical contact of the component with the circuit. Also disclosed is a method for obtaining the flexible circuit itself, the flexible circuit obtained by the method, and an ink for the method for obtaining a flexible circuit.

27 Claims, 32 Drawing Sheets

(51) Int. Cl.

| | |
|---|---|
| ***H05K 1/09*** | (2006.01) |
| ***H05K 1/185*** | (2026.01) |
| ***H05K 3/12*** | (2006.01) |
| ***H05K 3/22*** | (2006.01) |

(56) References Cited

U.S. PATENT DOCUMENTS

2018/0148584 A1* 5/2018 Chu ........................ C09D 11/52
2019/0110363 A1 4/2019 Bao et al.
2019/0159337 A1 5/2019 Wang et al.
2020/0296825 A1 9/2020 Ozdoganlar et al.
2020/0328007 A1 10/2020 Majidi et al.
2022/0334616 A1* 10/2022 Lee ...................... H10K 59/131

FOREIGN PATENT DOCUMENTS

TW 201842832 A 12/2018
WO 2015129546 A1 9/2015
WO 2016145309 A1 9/2016

OTHER PUBLICATIONS

Suji Choi et al., "High-performance stretchable conductive nanocomposites: materials, processes, and device applications", Chem, Soc, Rev., Mar. 2019, pp. 1566-1595.
Mahmoud Tavakoli et al., "Carbon doped PDMS: conductance stability over time and implications for additive manufacturing of stretchable electronics", Journal of Micromechanics and Microengineering, Feb. 2017 (13 pages).
Shu Zhu et al., "Ultrastretchable Fibers with Metallic Conductivity Using a Liquid Metal Alloy Core", Advanced Functional Materials, May 2013 (7 pages).
B. Arda Gozen et al., "High-Density Soft-Matter Electronics with Micron-Scale Line Width", Advanced Materials, Aug. 2014, 5211-5216.
Andrew Fassler et al., "3D structures of liquid-phase Galn alloy embedded in PDMS with freeze casting", Lab Chip, Sep. 2013, pp. 4442-4450.
Seung Hee Jeong, "Tape Transfer Atomization Patterning of Liquid Alloys for Microfluidic Stretchable Wireless Power Transfer", Scientific Reports, Feb. 2015 (7 pages).
Rebecca K. Kramer, "Masked Deposition of Gallium-Indium Alloys for Liquid-Embedded Elastomer Conductors", Advanced Funtional Materials, Nov. 2013, pp. 5292-5296.
Mohammad Rashed Khan et al., "Localized Instabilities of Liquid Metal Films via In-Plane Recapillarity", Advanced Materials Interfaces, Dec. 2016 (5 pages).
Yi Zheng et al., "Personal electronics printing via tapping mode composite liquid metal ink delivery and adhesion mechanism", Scientific Reports, Apr. 2014 (8 pages).
Collin Ladd et al., "3D Printing of Free Standing Liquid Metal Microstructures", Advanced Materials, Sep. 2013, pp. 5081-5085.
Tong Lu et al., "Soft-Matter Printed Circuit Board with UV Laser Micropatterning", Applied Materials & Interfaces, Jun. 2017, pp. 22055-22062.
Tong Lu et al., "Rapid Prototyping for Soft-Matter Electronics", Advanced Functional Materials, Jun. 2014, pp. 3351-3356.
Chengfeng Pan et al., "Visually Imperceptible Liquid-Metal Circuits for Transparent, Stretchable Electronics with Direct Laser Writing", Advanced Materials, Mar. 2018 (9 pages).
Alexander Cook et al., "Shear-driven Direct-write Printing of Room Temperature Gallium-based Liquid Metal Alloys", Advanced Engineering Materials, Nov. 2019 (30 pages).
Arya Tabatabai et al., Liquid-Phase Gallium-Indium Ally Electronics with Microcontact Printing, American Chemical Society, Apr. 2013, pp. 6194-6200.
Guangyong Li et al., "A galinstan-based inkjet printing system for highly stretchable electronics with self-healing capability", Lab Chip, Mar. 2016, pp. 1366-1373.
Rui Guo et al., "One-Step Liquid Metal Transfer Printing: Toward Fabrication of Flexible Electronics on Wide Range of Substrates", Advanced Materials Technologies, Dec. 2018 (13 pages).
Guangyong Li et al., "An advanced selective liquid-metal plating technique for stretchable biosensor applications", Lab Chip, Aug. 2017, pp. 3415-3421.
Rui Guo et al., "Semi-liquid metal and adhesion-selection enabled rolling and transfer (SMART) printing: A general method towards fast fabrication of flexible electronics", Science China Materials, Feb. 2019, pp. 982-994.
Daniel Félix Fernandes et al., "Digitally printed stretchable electronics: a review", J. Mater. Chem. C., Sep. 2019, pp. 14035-14068.
Kadri Bugra Ozutemiz et al., "EGaIn-Metal Interfacing for Liquid Metal Circuitry and Microelectronics Integration", Advanced Materials Interfaces, May 2018 (13 pages).
Bowei Zhang et al., "Flexible packaging of solid-state integrated circuit chips with elastomeric microfluidics", Scientific Reports, Jan. 2013 (8 pages).
Seung Hee Jeong, "Liquid alloy printing of microfluidic stretchable electronics", Lab Chip, Sep. 2012, pp. 4657-4664.
Tong Lu et al., "Soft Anisotropic Conductors as Electric Vias for Ga-Based Liquid Metal Circuits", American Chemical Society, Nov. 2015, pp. 26923-26929.
Navid Kazem et al., "Soft Multifunctional Composites and Emulsions with Liquid Metals", Advanced Materials, Jul. 2017 (14 pages).
M A H Khondoker et al., "Fabrication methods and applications of microstructured gallium based liquid metal alloys", Smart Materials and Structures, Aug. 2016 (23 pages).
International Search Report for corresponding PCT Application No. PCT/IB2022/051654 dated Jun. 7, 2022 (4 pages).

* cited by examiner

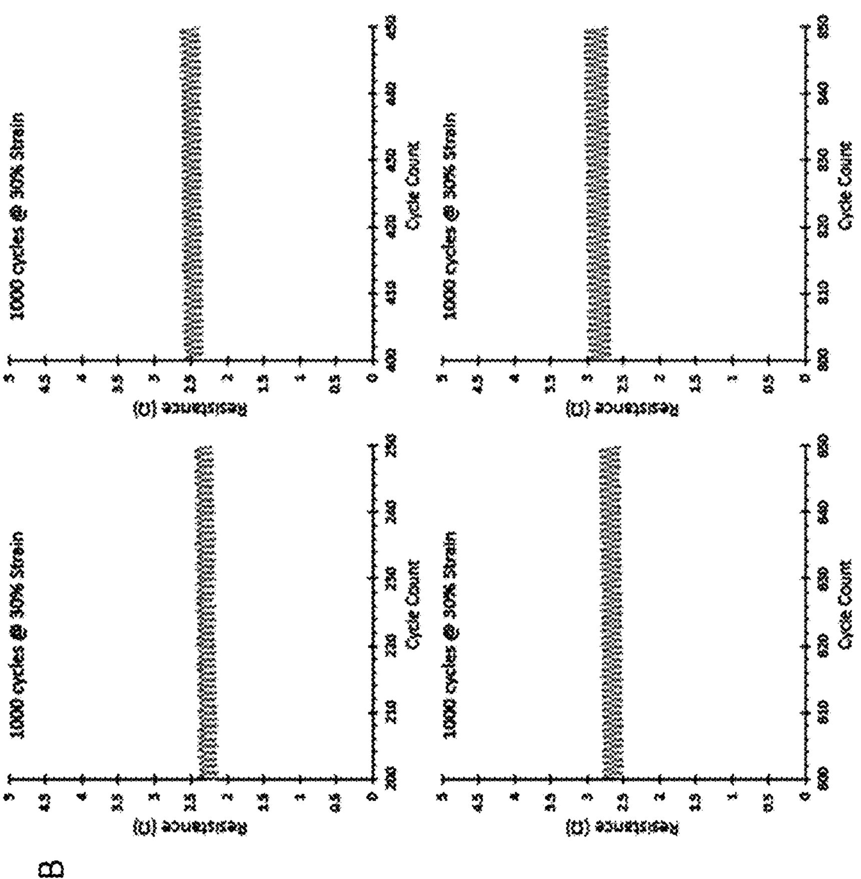
FIG. 11
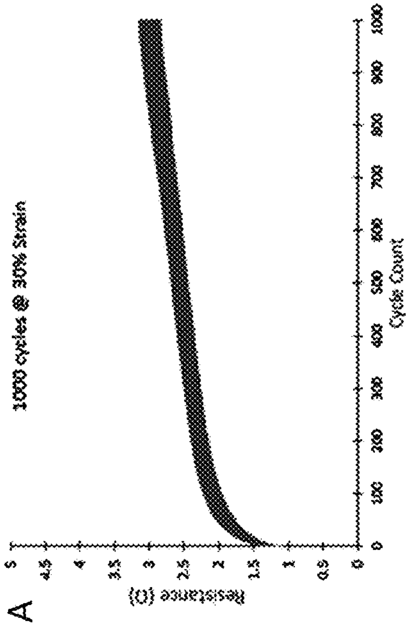

Atomic %

| | C | Ga | Ag | In |
|---|---|---|---|---|
| Z1 | 10 | 3 | 30 | 57 |
| Z2 | 15 | 76 | 2 | 7 |
| Z3 | 14 | 2 | 83 | 0 |
| Z4 | 26 | 56 | 9 | 13 |
| Z5 | 25 | 2 | 72 | 1 |
| Z6 | 66 | 3 | 33 | 1 |

FLEXIBLE PRINTED CIRCUIT, INK AND METHOD FOR OBTAINING FLEXIBLE PRINTED CIRCUIT THEREOF

CROSS-REFERENCE TO RELATED APPLICATIONS

This application is a U.S. National Stage Application under 35 U.S.C. § 371 of International Patent Application No. PCT/IB2022/051654, filed Feb. 24, 2022, which claims priority to Portugal Patent Application No. 117082, filed Feb. 24, 2021, the contents of which are each hereby incorporated by reference in their respective entireties.

TECHNICAL FIELD

The present disclosure relates to a method and device for providing self-soldering, self-coating, and self-healing ultra-stretchable printed circuits with integrated electronic components, in particular silicon chips.

BACKGROUND

Soft electronics, Printed electronics, and Stretchable electronics have a wide range of applications in flexible displays, sensors, health monitoring devices, structural electronics, motion sensing, and e-textiles. Materials and methods for fabrication of such circuits have been the focus of many research efforts during the last decade. Such efforts mostly focused on stretchable electrodes, interconnects, and sensors. However, the ultimate functionality of such systems remains dependent of solid-state technology (SST), from simple light emitting diodes (LEDs), to packaged integrated circuits (ICs) for data acquisition, processing and communication. Integration of SST into these circuits induces a drastic mechanical mismatch, resulting in a premature failure, and/or loss of the circuit functionality[1]. Also, one big challenge is that the process for integration of surface mount devices (SMD) into these circuits involves many steps, resulting usually in a labor intensive, and costly process. Addressing this challenge is the key for scalable fabrication of the stretchable circuits.

In the case of stretchable circuits, many efforts as well tried to directly print these circuits. Various types of conductive composites were also demonstrated, using different blends of elastic polymers and conductive micro/nanoparticles, nanowires, or nanotubes.[2,3] also, alloys of gallium and indium have been popular due to their fluidic compliance, high electrical conductivity, and their desirable behavior under strain. Methods reported for patterning of liquid-metal (LM) based circuits include injection moulding,[4] elastomer casting,[5] freeze casting,[6] stencil lithography,[7] selective wetting,[8] reductive patterning,[9] roller ball pen filled with LM,[10] 3D printing,[11] laser patterning.[12-15], direct-write extrusion[16], micro-contact printing,[17] printing using a custom-made inkjet head,[18] selective wetting with PMA glue[19], selective LM plating[20], and selective wetting of EGaIn and EGaIn—Ni amalgams over PMMA glue[21]. Reviews of some of these methods for digital printing of stretchable electronics can be found in recent literature.[22,23]

Despite these advanced on patterning the circuit interconnects, integration of SST chips into these circuits remained as the main challenge in this field. Traditional soldering techniques, cannot be used due to their incompatibility with the LM, and the heat sensitivity of many elastic substrates. Electrically conductive adhesives (ECAs), are popular for non-stretchable printed circuits, but ECAs demands for high precision selective deposition system, compatibility between the adhesive and the conductive ink; rapid SMD placement prior to the adhesive drying, precise motion control in component placement, for avoiding the spread of the conductive adhesive, and usually a thermal sintering step.

Some works demonstrated methods to address integration of SST into LM based stretchable circuits with innovative techniques. This includes interfacing connections using HCl vapor-treated EGaIn "solder"[24], and direct connection to a bare CMOS die[25]. Indirect integration uses flexible printed circuit boards (FPCBs)[26], or z-axis conductive films. In one example, a maximum strain of ~100% was achieved[28] using an engineered anisotropic conductor for interfacing the chips to LM circuit, but a protective sealing layer was necessary to hold the microchip in place. In the absence of this layer, the maximum strain reduced from 100% to 30%.

Moreover, the existing solutions require many fabrication steps, including deposition of a number of materials before and after chip interfacing, which should be cured or sintered afterwards, resulting in solutions that are complex, and expensive to automate. Addressing this challenge is the key for scaling the production, and commercialization of stretchable circuits.

These facts are disclosed in order to illustrate the technical problem addressed by the present disclosure.

GENERAL DESCRIPTION

Methods for fabrication of stretchable circuits have advanced rapidly, but integration of microchips into these circuits remains the biggest challenge of the field, and a main obstacle against scalable fabrication. We introduce a method for fabrication of microchip integrated ultra-stretchable circuits that is able to withstand >600% of strain, over 5× higher than previously reported techniques.

Typically, circuits are first digitally printed by an extrusion printer and a conductive stretchable ink based on gallium, Indium, metallic particles, and a polymer. Electronic components, for example SMD microchips, are placed over by a pick and place machine.

This is followed by an external stimulus that results in a solid-gel transition, similar to a hard-soft transition, both in the polymeric substrate and in the polymer-containing ink.

This polymeric substrate and the ink polymer can be, for example, a Styrenic block copolymer (SBC) containing both chemical and physical cross-links.

Therefore, the microchip penetrates into the softened gel-like ink, and both the ink and the chip penetrate into the softened gel-like substrate. The body of the chip gets surrounded by the substrate entirely on all of its perimeter. The ink itself descends into the substrate, thus gets encapsulated by a protective layer.

An external stimulus is suitably selected to cause the solid-gel transition in a suitably selected polymer. For example, in one embodiment, we used vapour and/or airborne droplet exposure as the external stimulus. Exposure to vapour of a liquid that causes the solid-gel transition on the polymer and in the ink, can be exploited for this purpose. Besides, vapor exposure results in at least 2× improvement in the ink conductivity, and increases the maximum strain of the printed lines to a value of around 1200% by elimination of the micro cracks of the substrate. Moreover, a fully cut circuit can be healed, for example by application of vapor, so effectively that it can withstand strains again. This "self-soldering", "self-coating", and "self-healing" process is an important contribution toward scalable fabrication of microchip-integrated stretchable and resilient circuits. The entire process can be performed at the room temperature.

We disclose materials and methods for fabrication of printed electronics, soft electronics, and stretchable electronics with integrated microchips. Unlike existing methods that require several fabrication steps, such as selective deposition of films, and adhesives, sintering procedures, and final coating, this process includes only 3 simple steps (see for example, FIG. 1), printing a multi-material ink, placing the components, and a treatment that induces a transition between the solid state and a gel state. Such transition happens both in the ink and in the substrate and is central for functionality of this process. The solid-gel transition (similar to a hard-soft transition) is exploited in a series of steps that contribute for simplification of the fabrication as well as improvement of the electromechanical properties, and resilience of the system. This includes self-soldering, self-coating, self-healing, and circuit transfer to other substrates.

The gel state here is characterized as a state which softens sufficiently the polymer, resulting in changes on the interface between an external object and the polymer. The reversible transition between these two states is performed through application of an external stimulus e.g., through exposing the system to the vapor of the solvent, or by application of heat, pH, light, magnetic field, or other methods, that are able to cause the polymer to go through a solid-gel transition. Such transition should be reversible, meaning that it should be possible to go through a solid-gel transition, and gel-solid transition at least one time, but preferably it should be possible to do so, repeatedly. As both the ink and the substrate contain such polymer, application of the stimulus induces the transition on both of them. At this gel state, the chips that were placed previously on the circuit above the printed ink, can penetrate into the ink and the substrate due to the gravity force (see for example, FIGS. 2A˜D). The ink may also climb the perimeter of the chip, due to the expansion in the size, and/or capillary effects. This results in establishment of electrical connection between the pads of the component and the printed circuit (see for example, FIG. 2B). At the same time the silicon chip penetrates into the substrate, and the polymer can additionally wet walls of the chip as well. In addition, if the printed ink has a higher density than the polymeric substrate, which is usually the case, the ink descends into the substrate, resulting in a "self-coating" which eliminates the need for posterior encapsulation. If the exposure time to the external stimulus is enough, the chip gets surrounded by the gel on all of its four side walls, and as well the bottom wall (see for example, FIG. 1 and FIG. 2C,D). Also, capillary forces, or the expansion of the polymer volume during the gel phase, causes the gel to climb the walls of the microchip, and thus further improving its fixture to the substrate. Once the gel goes back to solid state, the components and the ink become immobilized in their position. If necessary, the time of exposure to the stimulus can be adjusted so that the ink or the microchip, or both are fully covered by the gel. This "Self-soldering" procedure allows for seamless integration of microchips into circuits, using a facile method that does not involve selective addition of adhesives, inks, polymers, or films prior to placement of the microchip, or after that. We show that when this technique is used with a stretchable substrate and a stretchable conductive ink, circuits with integrated chips can withstand up to 1000% of the strain, prior to electrical failure.

In this disclosed method, we exploit the reversible solid-gel transition of elastic polymers as a versatile method for fabrication of microchip-integrated ultra-stretchable circuits. To enable the solid-gel transition, we disclose a simple vapor exposure technique as one possible method. Exposure to vapour of a liquid that causes the solid-gel transition on the polymer and in the ink, can be exploited for this purpose. This technique not only can be used for interfacing the microchips to the printed circuits, it as well improves the electrical and mechanical properties of the circuit, through enhancing the conductivity of the printed traces and healing the micro-cracks of the substrate. This method as well results in an interesting self-coating phenomenon which encapsulates the printed traces with a very resilient protective layer from polymer. If the circuit is cut, an external stimulus like vapor and/or airborne droplets exposure heals effectively the circuit, to a point that can withstand strain again. This procedure can be used for integration of the printed circuit with the integrated chips into textiles.

The circuit can be produced in only 3 steps of printing, microchip placing, and vapor exposure. To print the circuit, in some embodiment we used block-copolymer substrates such as SIS (Styrene-Isoprene), and SBS (Poly(styrene-butadiene-styrene)), and a SIS-Ag—Ga—In ink. The circuit can be printed using an extrusion printer, or patterned using a fiber laser. Unlike previous methods for interfacing microchips that require many fabrication steps, this technique is simple, single-step, and can be performed at the room temperature. Toluene vapor exposure transforms the solid substrate and the ink into adhesive gels that conforms to the silicon chips and surrounds the ICs body on 5 sides. We show a record-breaking maximum strain of >600% prior to electrical failure, and stable behavior for 1000 cycles of 100% strain, and 500 cycles of 400% strain. This enables the use of stretchable circuits in more demanding applications. Overall, this self-soldering, self-coating, and self-healing technique is a simple and versatile method, and an important step toward reducing the complexity of microchip-interfacing, and thus for scalable fabrication of microchip integrated stretchable circuits.

Although Styrene-isoprene block copolymers (SIS) is used in this work in the substrate and in the ink formulation, this method can be extended to other polymers that can go through a reversible phase transition through an external stimulus such as vapor or thermal treatment.

It is disclosed a method for obtaining a flexible printed circuit with a solid-state electric or electronic component, the method comprising:

printing an electric circuit with a conductive flexible polymer-based ink over a polymeric substrate in the solid state, wherein both polymers in the ink and the substrate are reversible solid-gel phase transition polymers;

placing the component over the substrate and over the electric circuit;

applying an external stimulus that results in a solid to gel transition of the polymeric substrate and ink, such that the component penetrates into the softened substrate, establishing an electrical contact of the component with the printed circuit.

The component may penetrate partially or fully into the substrate.

It is also disclosed a method for obtaining a flexible printed circuit, the method comprising:

printing an electric circuit with a conductive flexible polymer-based ink over a polymeric substrate in the solid state, wherein both polymers in the ink and the substrate are reversible solid-gel phase transition polymers;

applying an external stimulus that results in a solid to gel transition of the polymeric substrate and ink, such that the ink penetrates into the softened substrate for obtaining the flexible printed circuit.

In an embodiment, the application of the external stimulus results in a solid to gel transition of the polymeric substrate and ink, such that the ink and the component penetrate into the softened substrate for establishing electrical contact of the component with the flexible printed circuit and simultaneously obtaining the flexible printed circuit.

In an embodiment, the solid-state component is a solid-state electronic component having two or more leads extending from a side of said component, in particular the solid-state component is a surface-mounted integrated solid-state electronic component.

An embodiment subsequently comprises the step of removing the external stimulus that results in a gel to solid transition of the polymeric substrate and ink, such that the ink and, if existing, the component, are lodged in the substrate.

In an embodiment, a method for recovering a component or components of the printed circuit, further comprising the steps of:

Dissolving the printed circuit with a solvent that dissolves the polymeric substrate, and the polymer in the ink;

Recovering the printed circuit component or components, for example using a mesh filter Recovering the particles, and metals existing in the ink from the solution, for example using a filter or a centrifuge method In an embodiment, the polymer is selected to have adhesive properties during its gel state.

In an embodiment, the solid to gel transition of the substrate comprises softening the substrate and the ink for a period of time, such that the ink and, if existing, the electronic component penetrate into the softened substrate until the ink and electronic component are fully encapsulated within the substrate.

In an embodiment, the solid to gel transition of the substrate comprises softening the substrate and the ink for a period of time, such that the gel substrate climbs over the electronic component and surrounds said component, due to capillary action.

In an embodiment, the ink has a higher density than the substrate such that the ink, when penetrating the substrate, descends into the substrate under the effect of gravity and is encapsulated within the substrate.

An embodiment further comprises:

placing the ink and, if existing, the electronic component in relation to the substrate such that the ink and, if existing, the electronic component penetrate into the softened substrate under the effect of gravity, or applying a mechanical force over the electronic component, if existing, such that the ink and the electronic component penetrate into the softened substrate.

An embodiment, for repairing (i.e. healing) said printed circuit when the circuit has been subjected to an interruption, comprises the step of repeating the application of the external stimulus that results in a solid-gel transition of the polymeric substrate and ink, such that the ink electrically reconnects said interruption.

In an embodiment, the flexible printed circuit is stretchable.

In an embodiment, the substrate and the ink are selected such that solid-gel transition is reversible for at least a predetermined number of transitions.

In an embodiment, the polymer of the polymer-containing ink and the polymer of the polymeric substrate are the same polymer.

In an embodiment, the polymer is selected from styrenic block copolymers (SBC), in particular styrene-isoprene block copolymers (SIS), Styrene-Ethylene-Butadiene-Styrene (SEBS), Styrene-Ethylene-Propylene-Styrene—SEPS, or polyurethanes, Thermoplastic polyurethane (TPU), Fluorine rubbers, silicones, polycarbonates, and/or Poly(ethylene terephthalate)-foils (PET)—Poly(ethylene naphthalate)—(PEN)—and Poly(imide)-foil (PI).

In an embodiment, the polymer is selected from styrene-isoprene block copolymers—SIS, Styrene-Ethylene-Butadiene-Styrene—SEBS, Styrene-Ethylene-Propylene-Styrene—SEPS.

In an embodiment, the polymer-containing ink and the polymeric substrate are styrene-isoprene block copolymers, SIS.

In an embodiment, the external stimulus for the solid-gel transition is exposure to vapour of a material that causes the solid-gel transition in the substrate and the ink, or selected from heat, Ph, light, magnetic field.

In an embodiment, the external stimulus for the solid-gel transition is exposure to solvent vapour, or airborne droplets and the solvent is a polymer-acceptable solvent.

In an embodiment, the ink comprises particles of a metal, liquid metal and a polymer.

An embodiment further comprises causing the ink to penetrate into the softened substrate such that the ink in the obtained printed circuit is non-smearing to the touch.

In an embodiment, the liquid metal is Gallium, Indium, or mixtures thereof.

In an embodiment, the ink comprises Ag flakes in a SIS elastomer, as well as Gallium-Indium alloy, forming an Ag—In—Ga-SIS composite.

In an embodiment, the Gallium-Indium is eutectic Gallium-Indium (EGaIn), forming a SIS-Ag-EGaIn ink.

In an embodiment, the ink further comprises Tin.

In an embodiment, the ink comprises Ni or Ferrite or Copper, or Zinc particles, or silver coated particles, in a SIS elastomer, as well as Gallium-Indium, forming a particle-In—Ga-SIS composite.

It is also disclosed a flexible or stretchable printed circuit manufactured by the method according to any of the disclosed embodiments.

In an embodiment, the printed circuit is comprised by a non-smearing structure formed by the printed electric circuit and the polymeric substrate.

It is also disclosed a conductive polymer-based ink for obtaining a flexible printed circuit over a polymeric substrate, comprising a reversible solid-gel phase transition polymer, particles of a conductive material, and liquid metal.

In an embodiment, the particles of a conductive material are metal particles or metal-coated particles.

In an embodiment, the ink contains an intermetallic combination of the liquid metal with the metal or metal-coated particles.

In an embodiment, the metal and gallium-indium combination and the mixing parameters thereof are adjusted for the formation of the intermetallic state in order to enhance the non-smearing behaviour of the ink.

In an embodiment, the intermetallic combination is $AgIn_2$.

In an embodiment, the particles of a conductive material are carbon-based particles.

In an embodiment, the ink comprises Ag flakes in a SIS elastomer, as well as Gallium-Indium, forming an Ag—In—Ga-SIS composite.

In an embodiment, the Gallium-Indium is eutectic Gallium-Indium (EGaIn), forming a SIS-Ag-EGaIn ink.

DESCRIPTION OF THE DRAWING FIGURES

FIG. 1 illustrates three steps for printing a multi-material ink, placing the components, and a treatment that induces a transition between the solid state and a gel state in accordance with the present disclosure.

FIG. 2A-D illustrate states in which a polymer softens from a solid to a gel with chips placed above the printed ink penetrate into the ink and the substrate due to the gravity force in accordance with the present disclosure.

FIG. 6A-C illustrates an ink comprising an alloy of $AgIn_2$ intermetallic compound within the ink.

Figure 7:
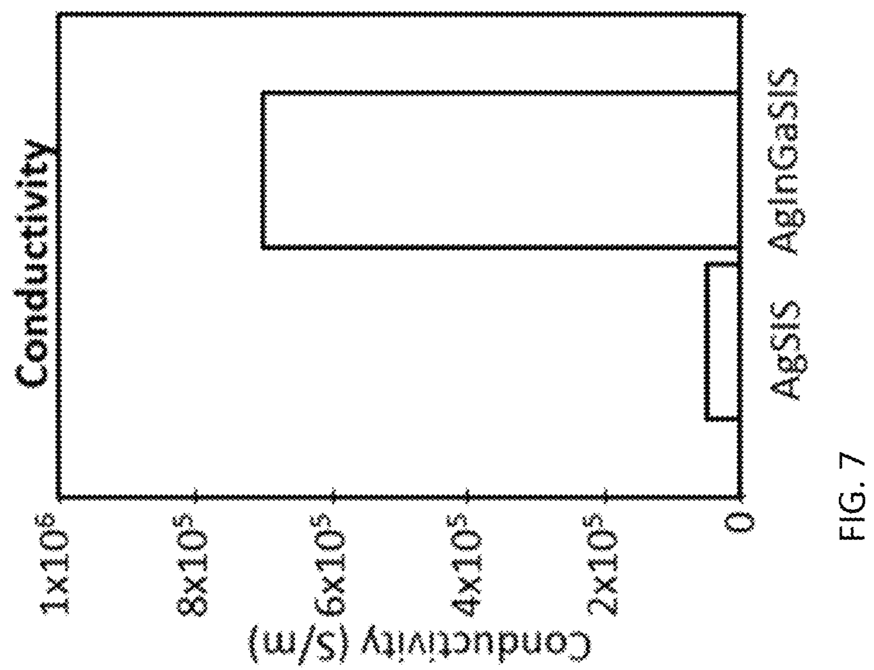

FIG. 7 illustrates the conductivity of certain alloys for the ink.

Figure 8:
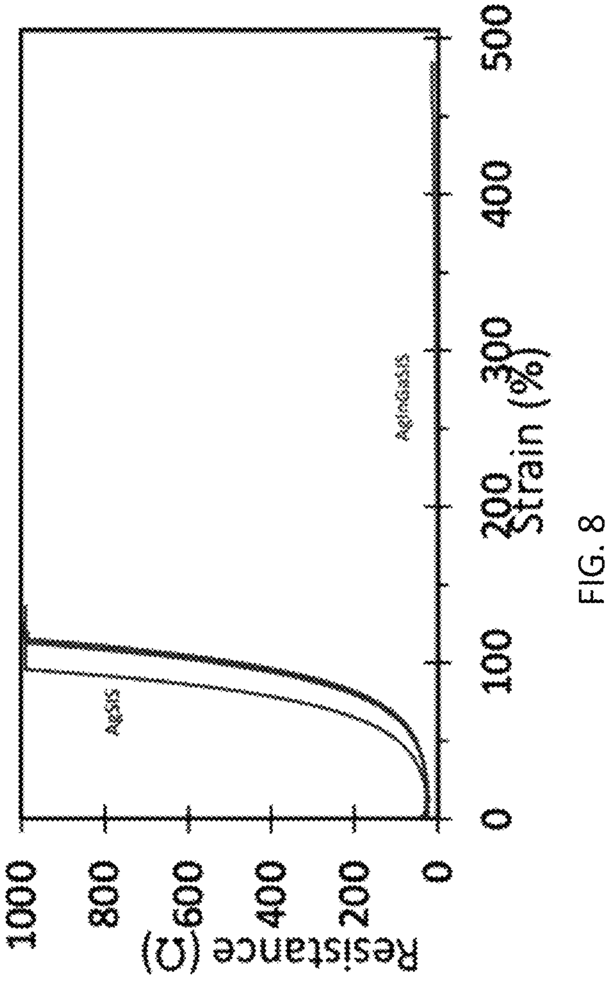

FIG. 8 illustrates resistance as a function of strain for certain alloys for the ink.

Figure 9:
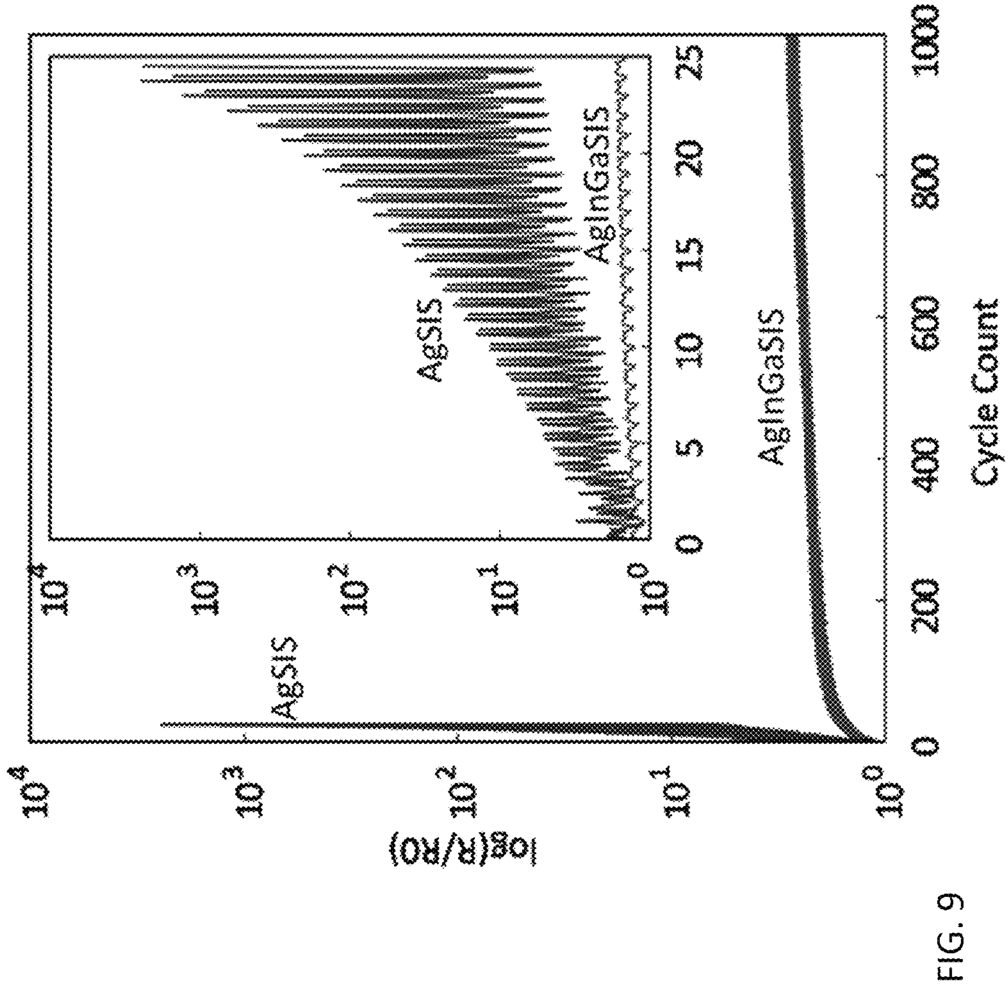

FIG. 9 illustrates electromechanical behaviour over repeated strain cycles.

Figure 10:
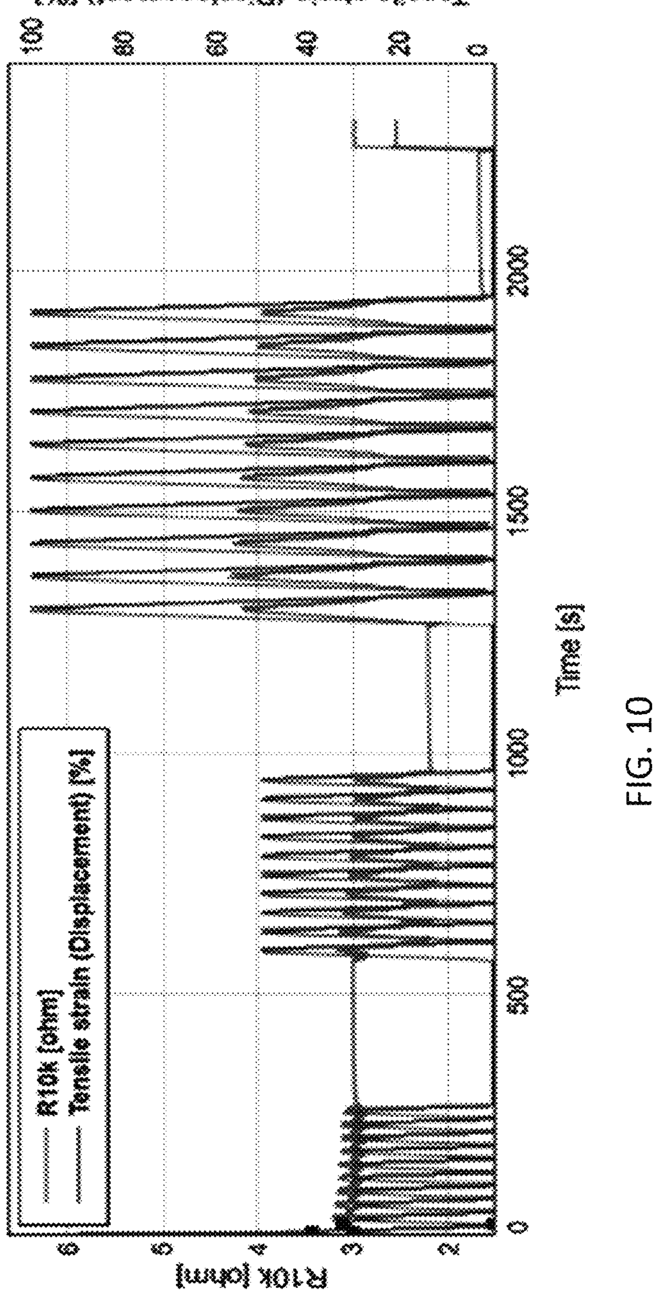

FIG. 10 illustrates repeated strain cycles for an alloy with Ag replaced by Nickel.

FIG. 11A-B illustrates repeated strain cycles for further examples of alloys.

Figure 12:
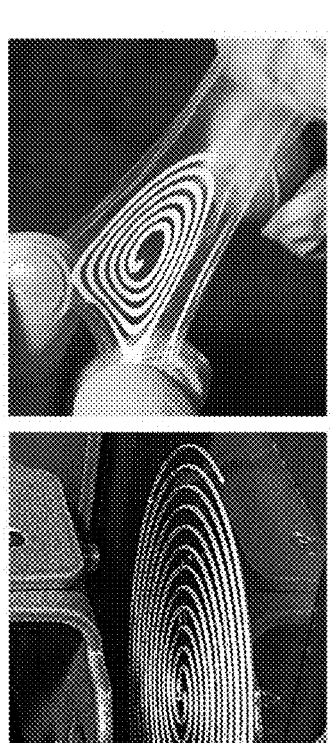
Figure 13:
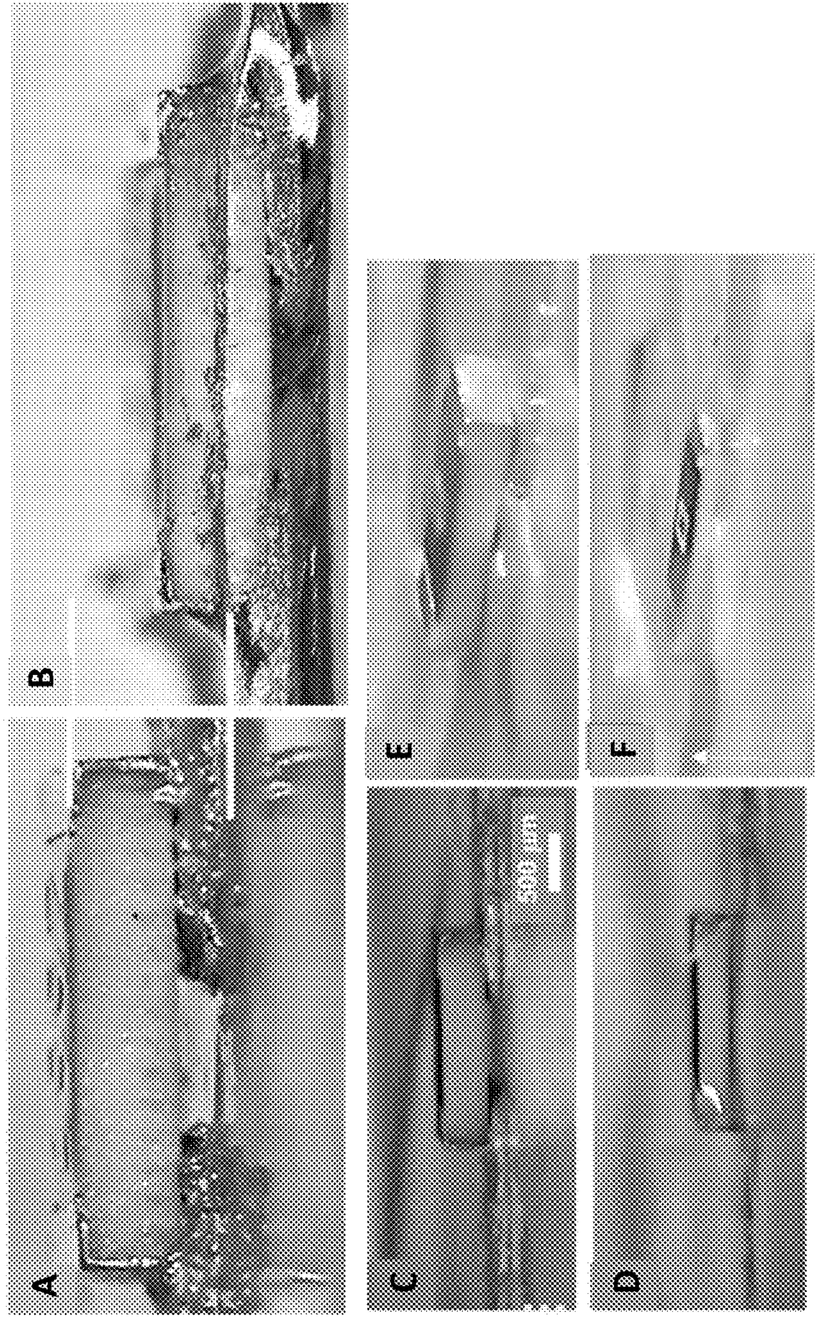

FIG. 12 illustrates examples of printed circuits in accordance with the disclosure.

FIGS. 13A-F illustrate chips before and after vapor exposure in accordance with the disclosure.

Figure 14:
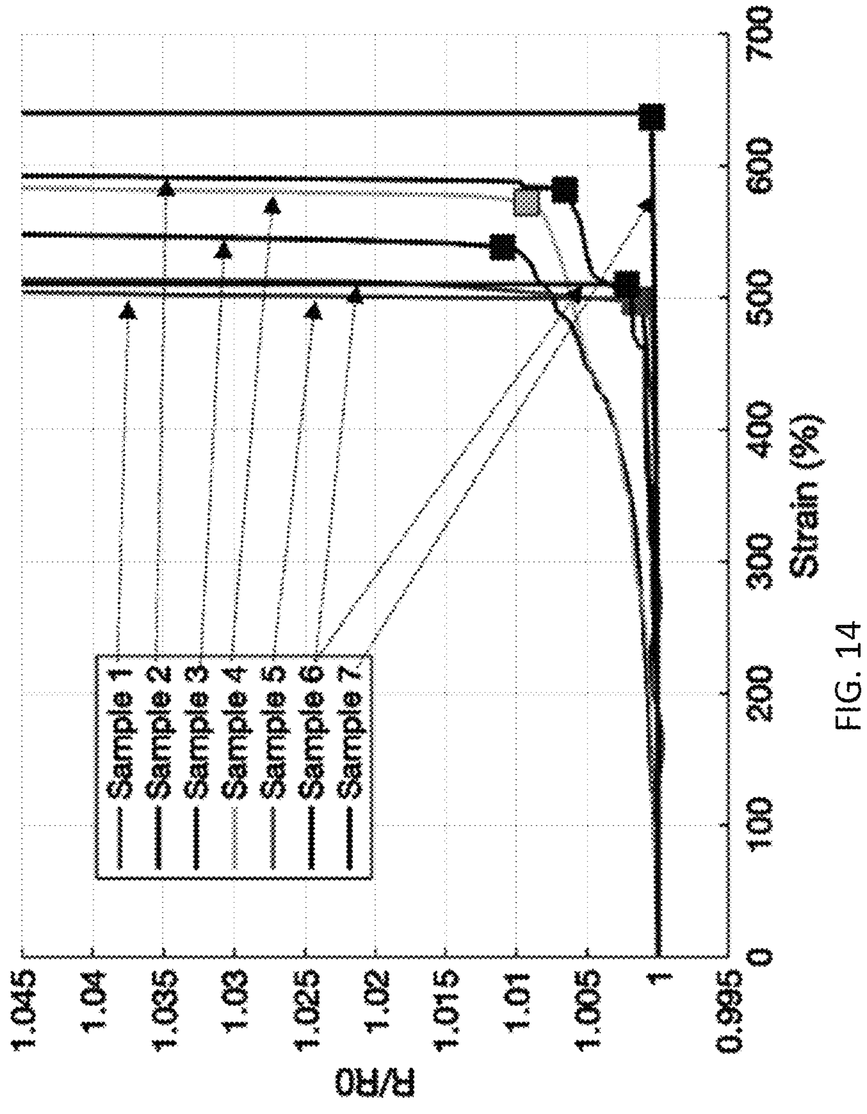

FIG. 14 illustrates a sample in accordance with the disclosure that could reach to a maximum of around 900% of strain.

Figure 15:
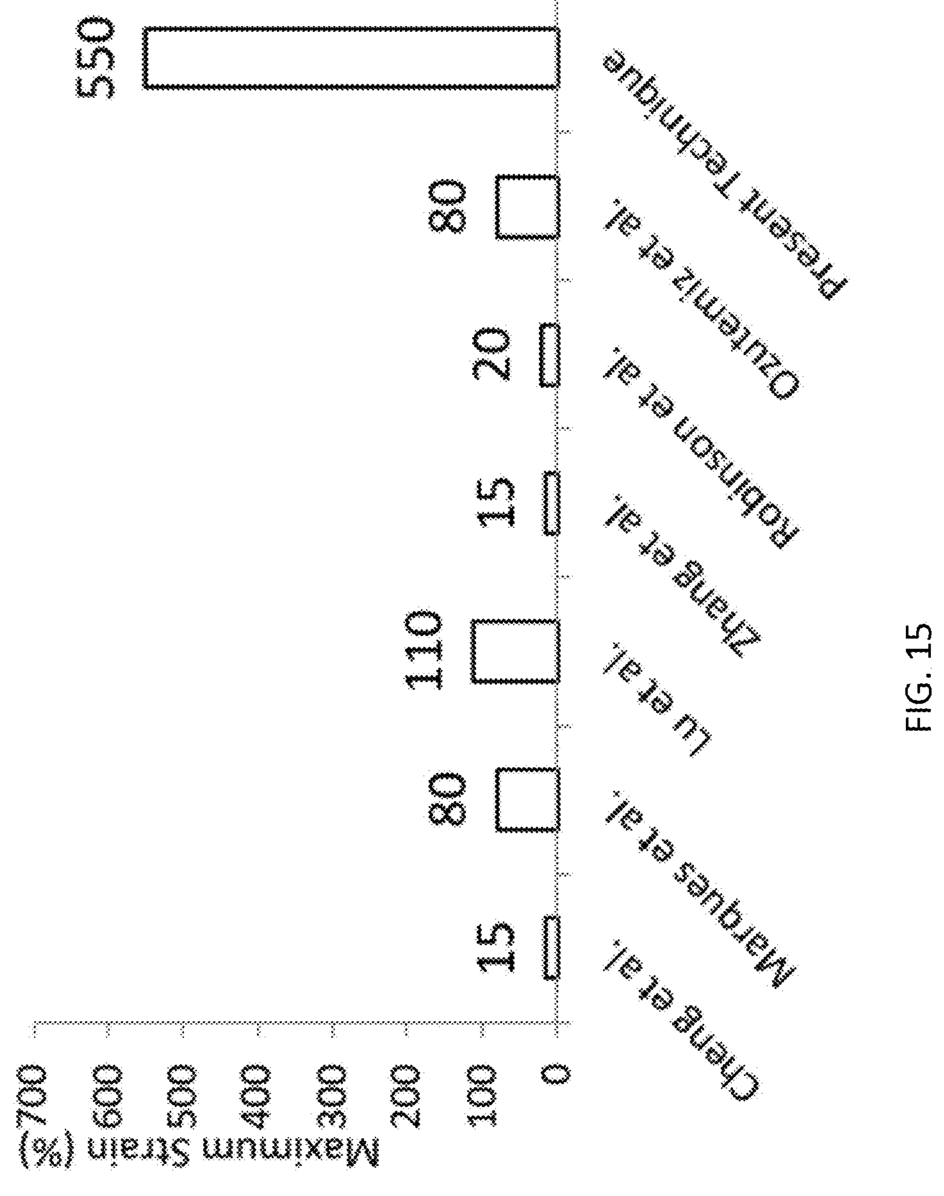

FIG. 15 illustrates strain tolerance of certain alloys in the prior art.

Figure 16:
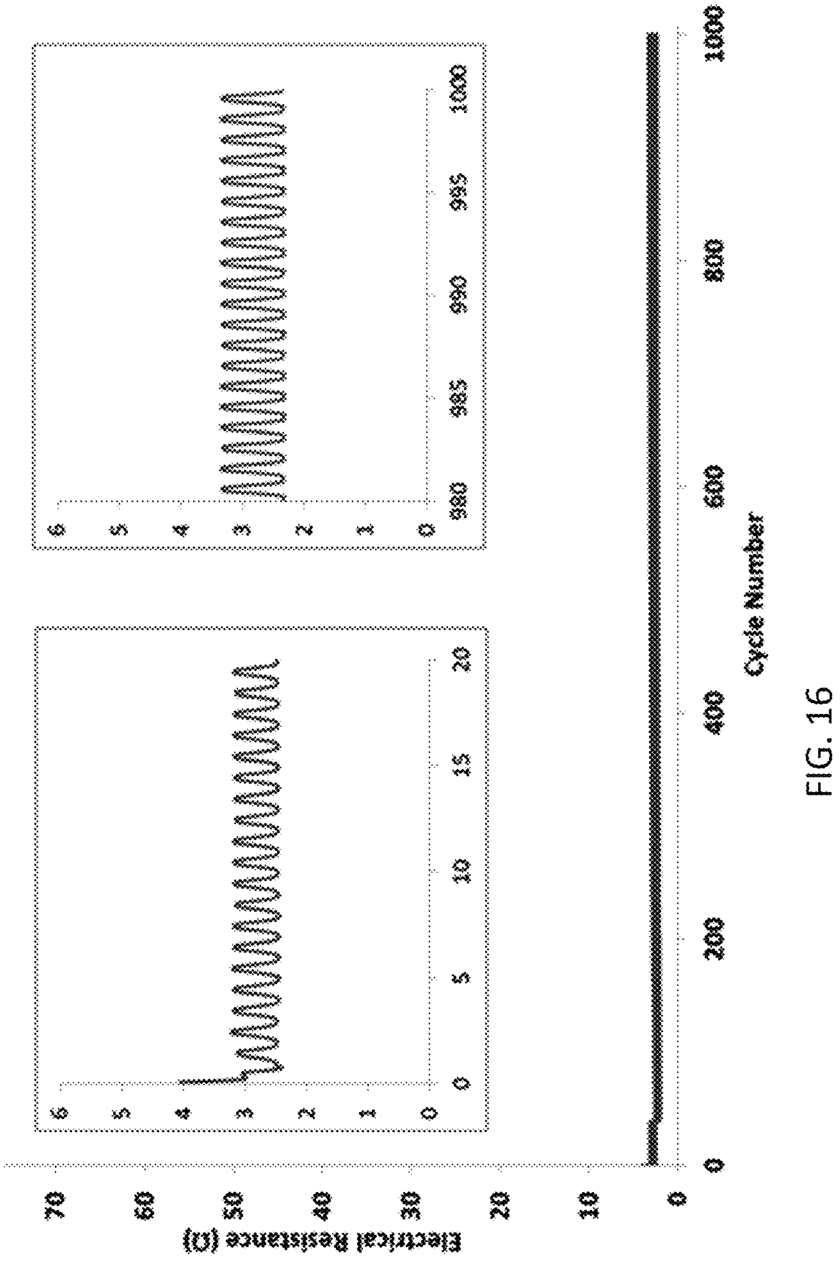

FIG. 16 illustrates a sample in accordance with the disclosure withstanding 1000 cycles of 100% strain without any sign of electrical or mechanical failures.

Figure 17:
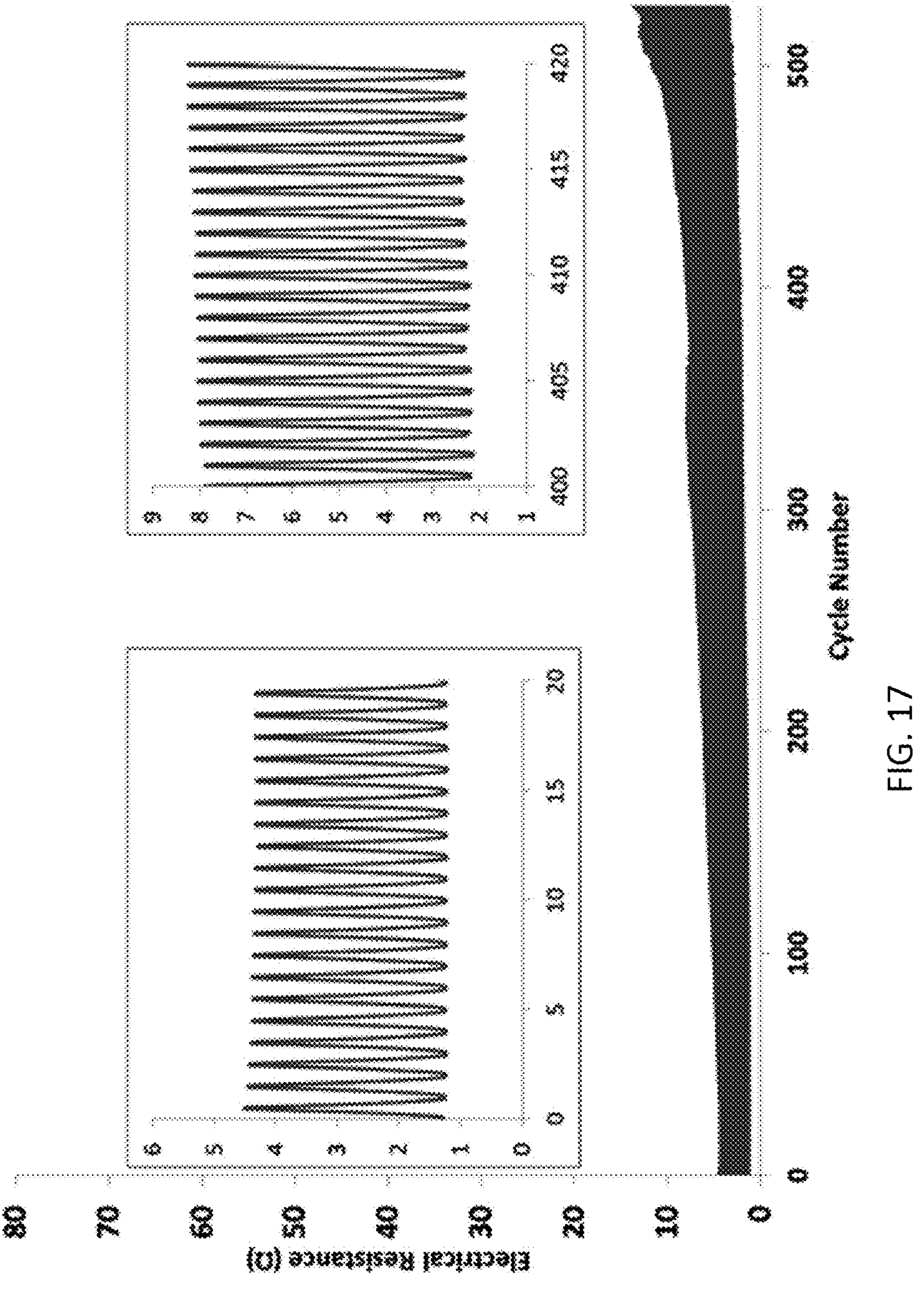

FIG. 17 illustrates a sample in accordance with the disclosure withstanding 1000 cycles of 400% strain, with 540 cycles withstanding the test.

Figure 18:
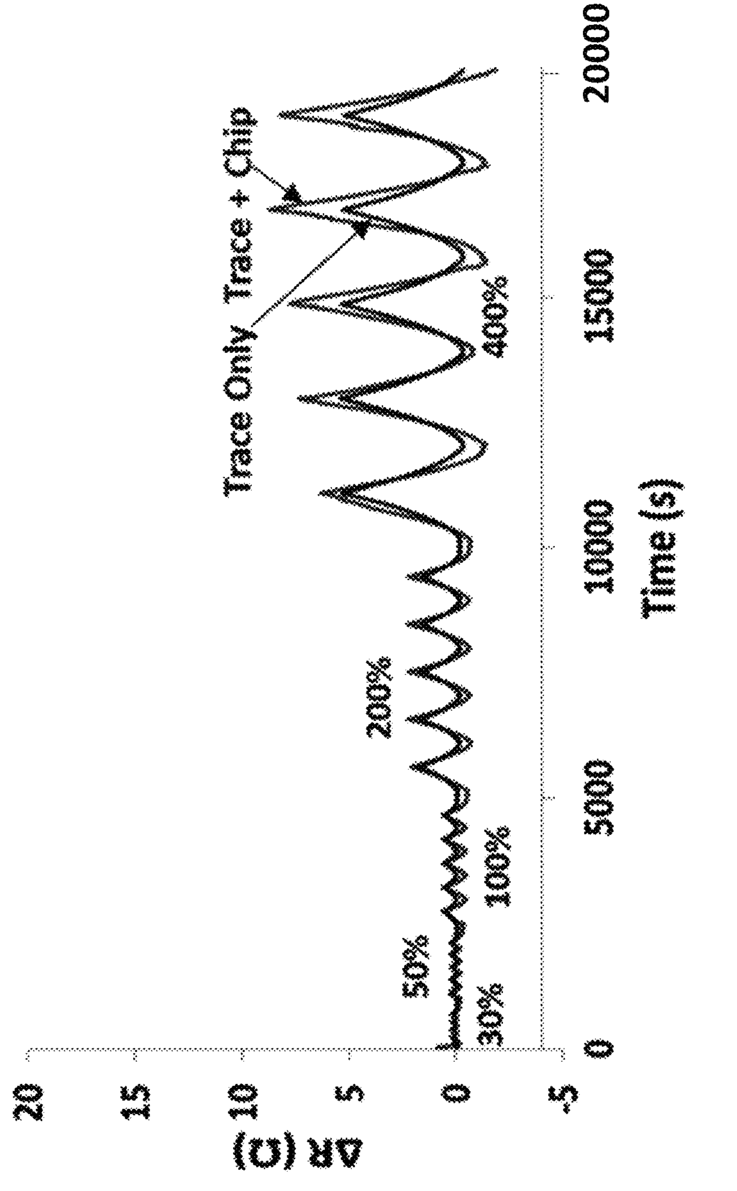

FIG. 18 illustrates a comparison of a printed trace with no chip with a chip-integrated sample, with both undergoing repeated cycles of 30-50-100-200-400% strain.

Figure 19:
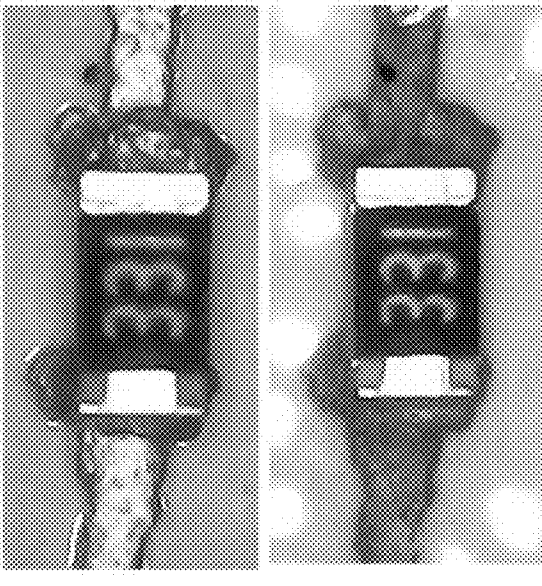

FIG. 19 illustrates a sample in accordance with the disclosure having self-coating over the printed inks, which eliminates the need for the cumbersome posterior coating.

Figure 20:
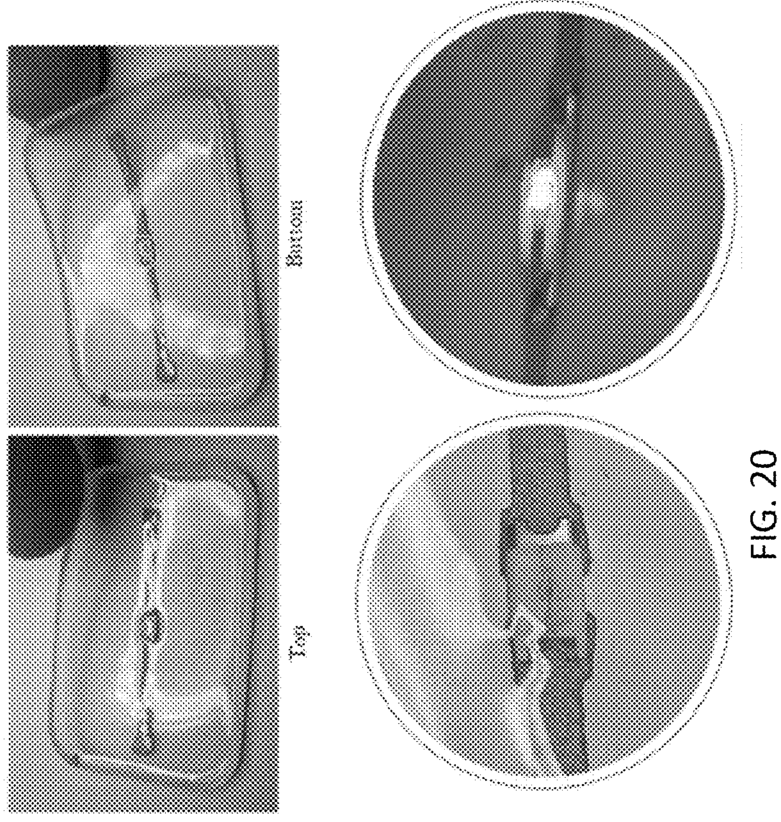

FIG. 20 illustrates a fully coated circuit having a 3 mm substrate which includes an LED.

Figure 21:
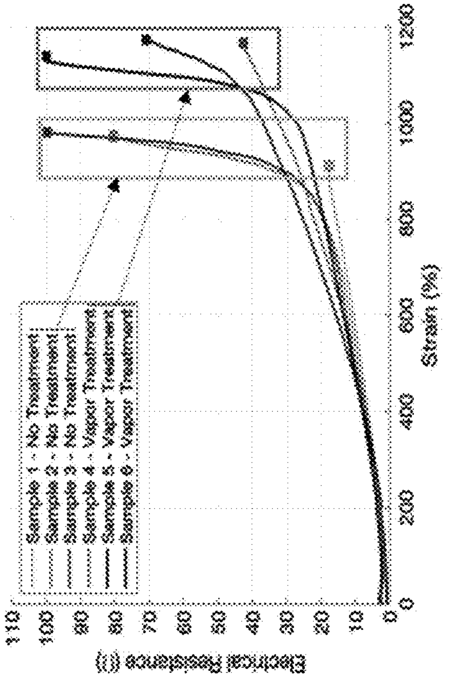
Figure 21:
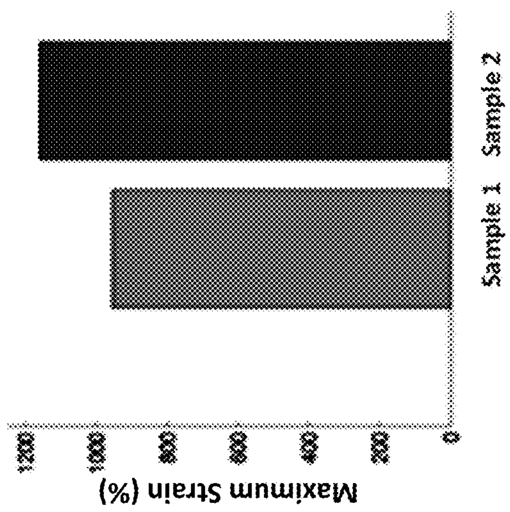

FIG. 21 is a plot of resistance verses train of data analyzed from Scanning Electron Microscopy images of a SIS substrate, showing the healing of micro cracks and smoothening of the substrate after treatment in accordance with the disclosure.

Figure 22:
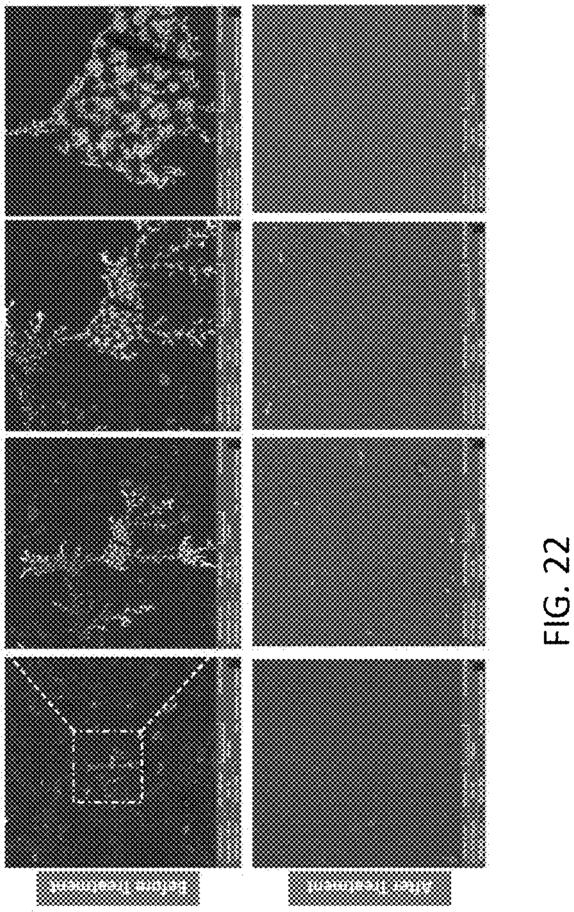

FIG. 22 shows printed circuit traces before and after treatment to heal and smooth cracks.

FIGS. 23A-D illustrate microstructure of ink in accordance with the disclosure having enhanced conductivity.

Figure 24:
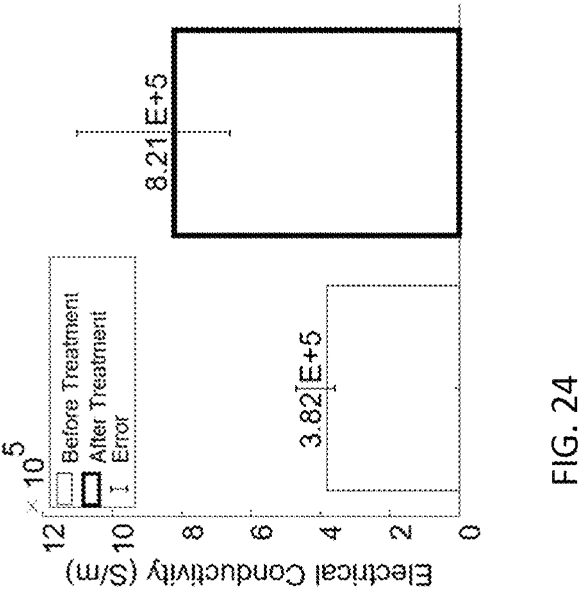

FIG. 24 illustrates improved electrical conductivity of ink in accordance with the disclosure.

FIG. 25A-F illustrate a comparison of inks in accordance with the disclosure before and after the vapor exposure.

Figure 26:
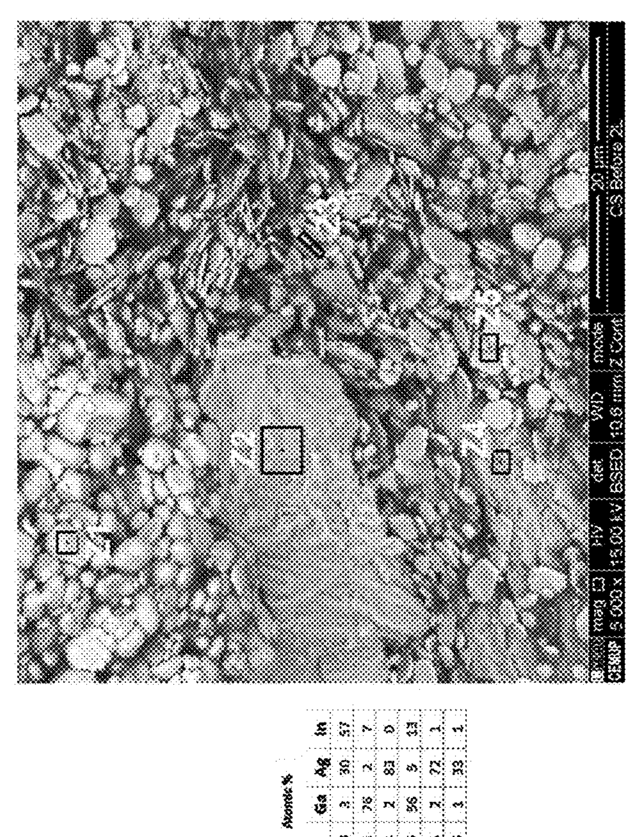

FIG. 26 illustrates an ink in accordance with the disclosure including microspheres of $AgIn_2$.

FIG. 27A-D illustrates a circuit with a through cut of the printed circuit and the substrate, with vapor exposure able to heal the circuit.

Figure 28:
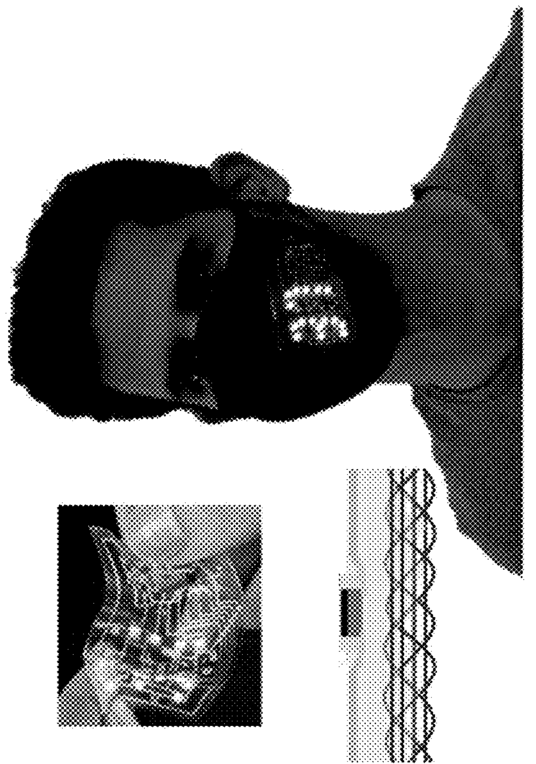

FIG. 28 shows a circuit transfer application with printed circuits transferred to textile using a solvent vapor to transition the substrate to a gel state, wet the textile fibers and integrate into the host fibers.

Figure 29:
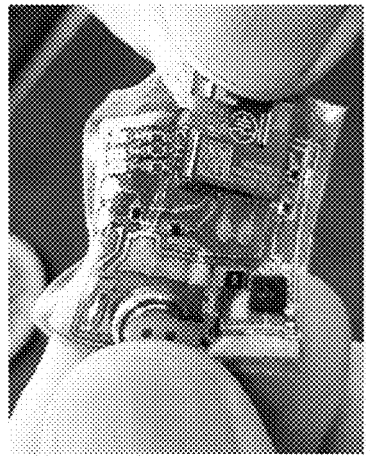
Figure 29:
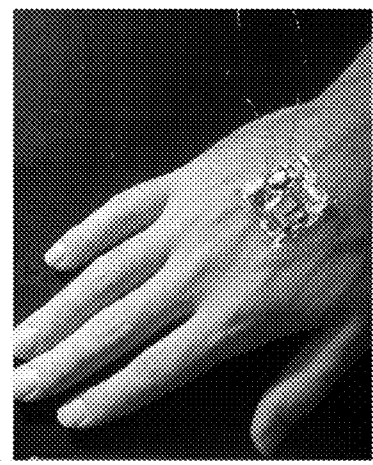

FIG. 29 shows a circuit produced by laser patterning using a fiber laser in accordance with the present disclosure.

FIGS. 30A-D illustrate further examples of microchip integrated printed and stretchable circuits in accordance with the present disclosure.

Figure 31:
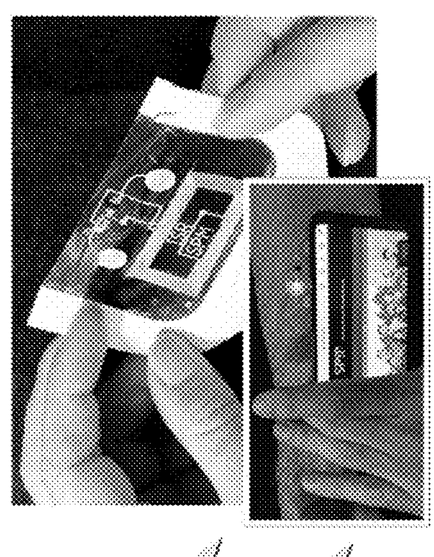
Figure 31:
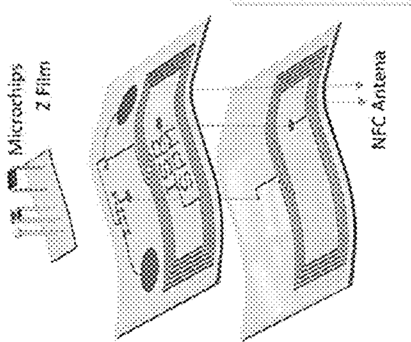

FIG. 31 illustrates a further example of a circuit in accordance with the present disclosure.

Figure 32:
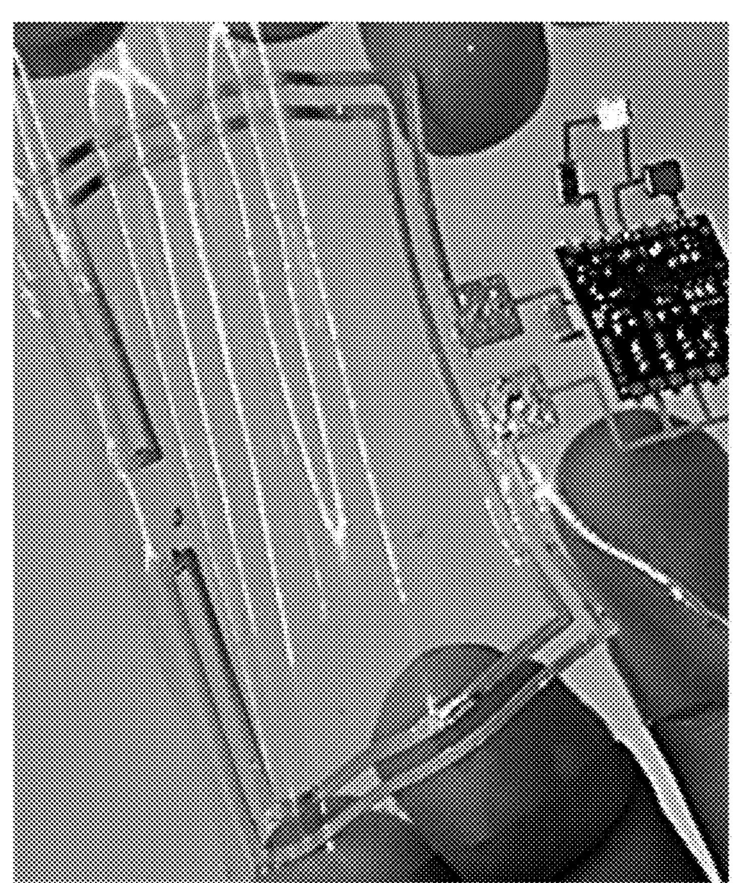

FIG. 32 shows still a further example of a printed circuit with RFID antenna for energy harvesting in accordance with the present disclosure.

DETAILED DESCRIPTION

In one example, we used Styrene Block Copolymers both as the substrate over which printing is performed, and as well in the formulation of the ink. In this example, we used Toluene vapor exposure as the stimulus for solid-gel transition in the ink and in the substrate. Examples of these polymers are Styrene-isoprene block copolymers (SIS), Styrene-Ethylene-Butadiene-Styrene (SEBS), Styrene-Ethylene-Propylene-Styrene (SEPS). They have elastic properties in solid phase, and excellent adhesion properties in the liquid phase. The choice of polymer can be extended to other types of elastic polymers. Non limiting examples include polyurethanes, silicones, fluoropolymers, polycarbonates, Poly(ethylene terephthalate)-foils (PET)—Poly(ethylene naphthalate)—(PEN)—and Poly(imide)-foil (PI), as long as a reversible solid-gel transition is possible. Although some increasing efforts has been made to make reversible transition in elastomers with chemical crosslining, generally polymers that have some physical crosslinks, such as block copolymers and thermoplastics are better candidates for this process as they can be easily processed after dissolved in various solvents. Dynamic Covalent Polymers can be as well used for this purpose.

The following pertains to the disclosed Ink application. We as well disclose an X-Indium-Gallium-Elastomer ink, which is preferred for the application of stretchable electronics. The ink does not require any sintering step after deposition, and is conductive right after deposition. The ink is preferably composed of at least 3 metals, i.e. In—Ga and X, which is a nano/micron size metallic particle, and an elastomer. The elastomer should be able to go through a reversible solid-gel transition, when subject to an external stimulus. The polymer matrix is necessary to allow the transition between the rigid and the gel states, which is necessary for the microchip to penetrate into the ink, and to establish a good electrical connection, and mechanical immobilization, without the need for the posterior encapsulation. Direct deposition of gallium alloys, or a mixture of gallium alloys with particles, results in a smearing ink that requires a coating layer, and besides does not work with the proposed self-soldering/self-coating method. The X-Indium-Gallium-Elastomer ink is non smearing to touch. The polymer as well acts as a binder and improves the integrity of the ink. It should be noted that although mixtures of Ga—In and elastomers such as silicones have been previously shown[29], but none of them became conductive after application. It was necessary to apply mechanical force to activate the ink. The disclosed ternary X-Indium-Gallium-Elastomer ink however does not require application of any activation force, despite having a polymer matrix.

Prior to the deposition or printing, the ink is in the gel state, as it contains the solvent of the polymer. This solvent does not allow polymerization of the elastomer in the composite prior to the deposition. After the deposition or printing, the solvent evaporates, allowing thus the polymerization of the elastomer to occur. The ink includes a solvent for adjusting viscosity and preventing polymerization when in the gel state.

The inclusion of the polymer in the X-Indium-Gallium-Elastomer contributes to a better adhesion of the ink to a wide range of substrates, especially if the polymer has adhesive properties during its gel state. The liquid metal itself, or liquid metal-based composites without the inclusion of an elastomer, can wet some substrates temporarily, due to the wetting properties of the gallium oxide layer.

However, such wetting depends on the surface properties, and furthermore, if circuits printed with these inks are exposed to a basic or acidic environment, such as hydrochloric acid vapour, the ink dewets from the surface. Therefore, they require a coating layer to protect the circuit. The disclosed X-Indium-Gallium-Elastomer bonds to the substrate due to the adhesive properties of the elastomer in the gel state.

Therefore, a subsequent coating is not necessarily required, and the inclusion of the elastomer results in an improved integrity of the composite after evaporation of the solvent. Thus, the printed circuit has a non-smearing behaviour, in contrast to liquid metal or liquid metal mixed with particles, that are both smearing, and whose adhesion is dependent on the fragile gallium oxide layer.

The attached figures provide preferred embodiments for illustrating the disclosure and should not be seen as limiting the scope of invention.

Figure 3:
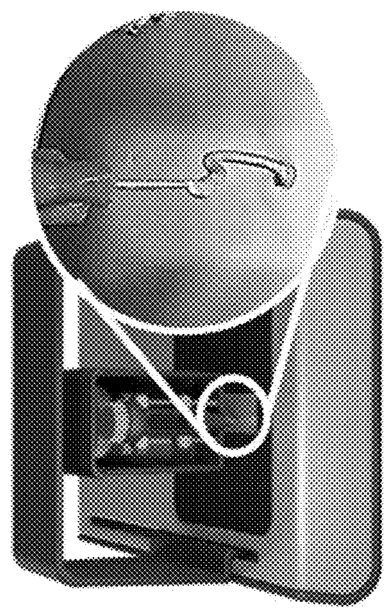
FIG. 3 illustrates ink that allows room temperature printing.
Figure 3:
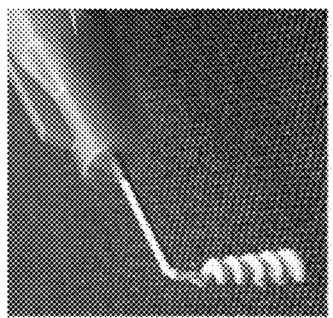
Figure 3:
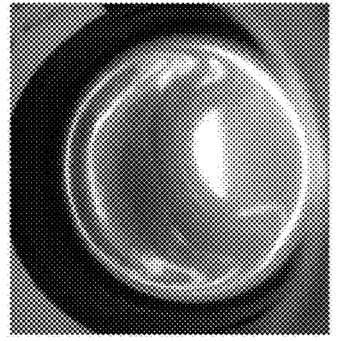
Figure 4:
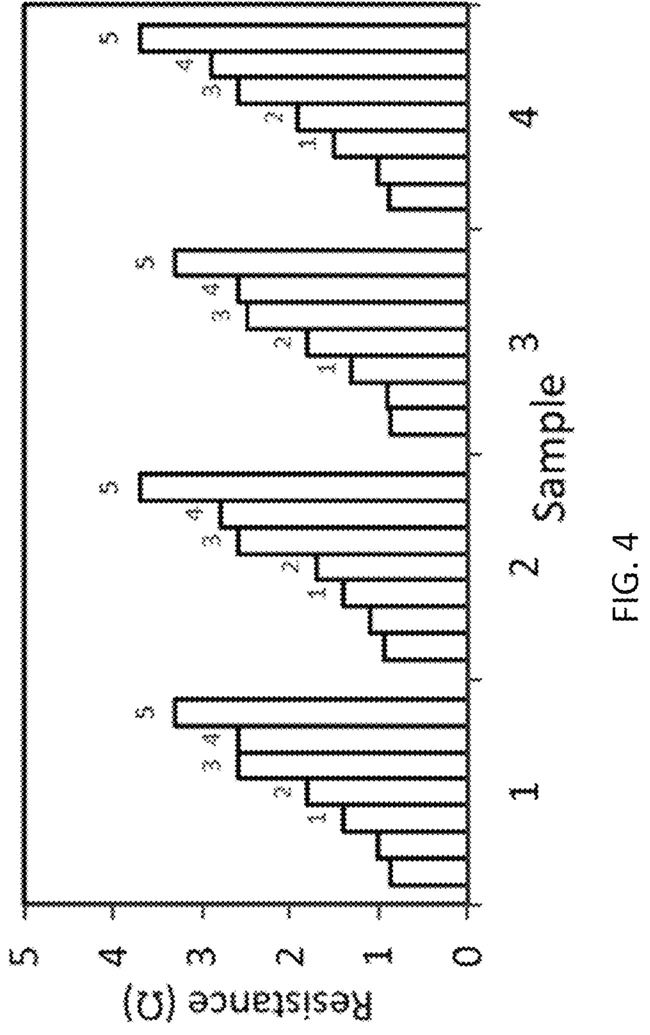
FIG. 4 illustrates an ink that can go through reversible solid-gel transition, and can resist some washing cycles.
Figure 5:
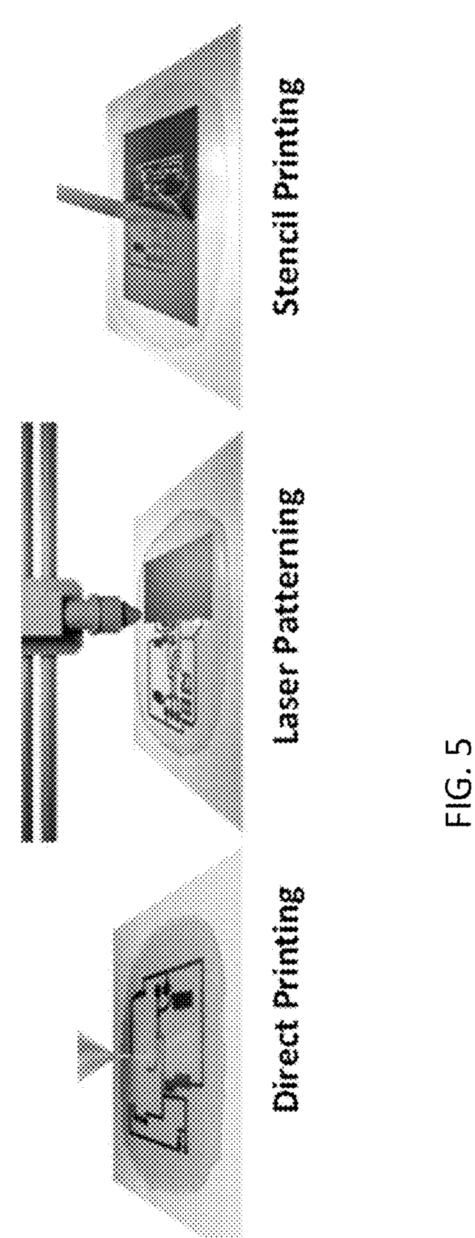
FIG. 5 illustrates an example of ink that can be printed by an ordinary extrusion printer, or by stencil printing, or applied over the substrate and patterned by a laser CNC.
Figure 6:
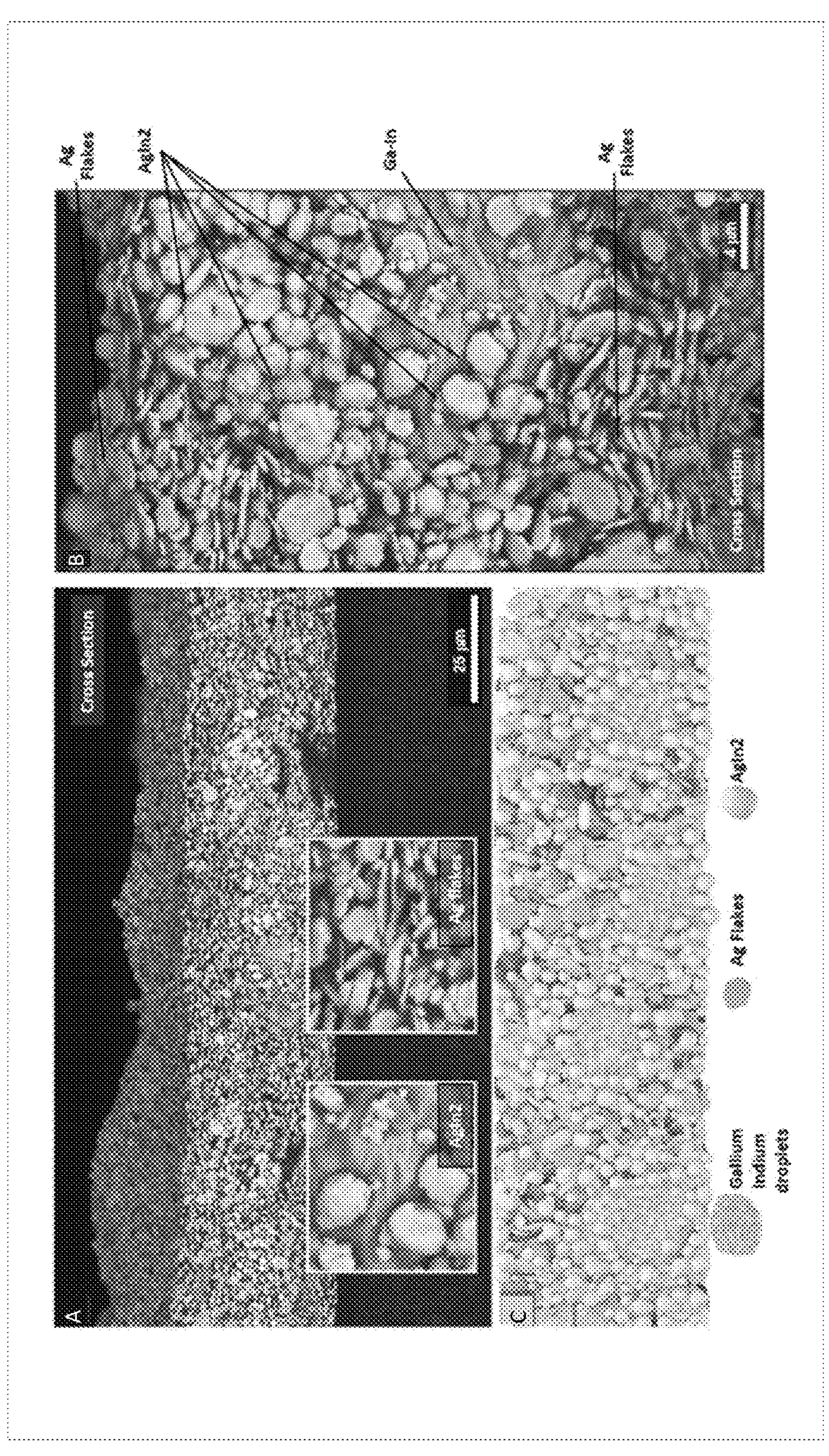

In one example, Ag flakes were used in the SIS elastomer, as well as gallium-indium which formed an Ag—In—Ga-SIS composite. This ink allows room temperature printing (FIG. 3), is non-smearing after the printing, can go through reversible solid-gel transition, and can resist some washing cycles (FIG. 4). This ink can be printed by an ordinary extrusion printer, or by stencil printing. Alternatively, a full layer of the ink is applied over the substrate and patterned by a laser CNC (FIG. 5). The ink contains both Ga—In and Ag—In alloys. The Ga—In is not necessarily eutectic. The ink is obtained by mixing a gallium-Indium alloy, into a composition of silver flakes and an elastomer, or an elastomer solution. The overall percentage of the metallic fillers, and the ratio between each of the metallic fillers determines the electrical and mechanical properties of the ink, and its behavior under the strain. Typically, the elastomer quantity is lower than 50 wt %, and can be as low as 1% of the whole composition, and the rest is filled by the metallic Ag—In—Ga microstructure. The ratio of Ag, In, and Gallium can be changed for the optimal elastic properties. The weight ratio of Ga—In:Ag can range from 10:1 to 1:10. Also Ga—In can be replaced by Ga—In-Tin. For the Ag—In—Ga ink, during the mixing, some indium from the gallium-indium ink is separated from this alloy and makes a new $AgIn_2$ intermetallic compound within the ink (FIG. 6). The AgIn2 compound is important in the non-smearing behavior of the ink after deposition, as it helps as a hinging point for the Ga—In alloy droplets.

This ink has excellent electrical conductivity in the same order of 10ˆ5-10ˆ6 S/m (FIG. 7), which is around 10 times better than the same Ag-SIS ink without Gallium-Indium. Also, this ink has a maximum strain tolerance of around 500% (FIG. 8), and stable electromechanical behaviour over repeated strain cycles (FIG. 9). Please note that 500% was achieved over a TPU polymer, and when the ink is printed over the Styrene Block Copolymers substrate and treated by vapor it could withstand over 1200% of strain.

In one example we replaced the Ag by Nickle and the ink could as well withstand strain cycles (FIG. 10). The conductive particle may be as well replaced by Ferrite, Zinc, and can be extended to other particles. In another example, SIS was replaced by TPU, and the ink was both conductive and stretchable without any sintering step (FIG. 11). Heating at low temperatures of <60° C. can accelerate the evaporation of the solvent, but it is not a necessary step for gaining conductivity, as the ink is conductive right after deposition, and the solvent can evaporate as well in the room temperature. In other word, percolation of the ink is not dependent to any sintering step, whether thermal, chemical, light based, etc. Examples of the printed circuits can be seen in FIG. 12.

The following pertains to the disclosed self-soldering. The proposed method facilitates the fabrication of SST-integrated stretchable circuits, by eliminating a number of processes. In printed electronics industry, after the first layer of the circuit is printed, microchip interfacing is performed through a number of steps, including selective deposition of conductive adhesives, placement of the chips, temperate sintering, and encapsulation. The proposed method for chip interfacing eliminates all these steps and results in a seamless integration of the chips into the circuit, with a single procedure. By enabling the solid-gel transition on the ink and the substrate, for instance by solvent vapor exposure, this method acts at three fronts. Once the ink and the substrate are on the gel state, the conductive pads of the chip adhere to the conductive ink, the bottom of the chip adheres to the underlying substrate, and as the chip penetrates into the substrate, the perimeter of the chip is surrounded by the adhesive in all 4 sides. Capillary forces also may contribute to this by climbing up the surface of the chip. In one example, to fabricate complex multi-layer, chip-integrated stretchable circuits, we used the above SIS-containing ink, a SIS substrate, an extrusion printer for printing the ink, and the Toluene vapor exposure as the stimulus for solid-soft transition. After printing the ink and placing the components, they were exposed to the vapor treatment in a chamber for few minutes (depending on the vapor concertation). FIGS. 13A˜F show the side view of some chips before and after exposure. During the process, as the substrate transforms to an adhesive gel, both the ink and the component penetrate into the substrate. The empty space between the chip and the substrate is fully filled, and the substrate gel surrounds the chip. After returning to the solid state, the elastomer immobilizes the chip from various points. Unlike traditional methods that only adhere to the chip from the bottom of the chip, this method immobilizes the chip from at least 6 sides, thus contributing to a higher resistance against torsional and twisting torques applied to the chip during bending, twisting, or strain. Overall, this self-soldering technique, results in a seamless integration of the microchip into the ink and the substrate, without the need for selective deposition of conductive/insulator adhesives, and additional sintering process, that can withstand a high amount of strain prior to the electrical failure. We then studied the electromechanically coupling and stability of the samples over repeated cycles Printed circuits with an integrated resistor chip were stretched until electrical failure. Most samples could withstand between 500-600% of strain, but some sample could reach to a maximum of around 900% of strain (FIG. 14). This is at least 6 times higher than any previously reported method to the best of our knowledge (FIG. 15)—Note that in contrast to previous works, no sealing layer is applied over the components to fix them to the circuit. The sample could withstand 1000 cycles of 100% strain (FIG. 16) successfully without any sign of electrical or mechanical failures. As can be seen the $R_0$ (measured resistance at 0% strain), $R_x$ (measured resistance at x % strain, x=100), and as well ΔR (in each 0%-x % cycle) remained almost constant in for the whole 1000 cycles. This is important for proper functionality of digital circuits. We then repeated the same test with a 400% cycle test. This time the sample could withstand 540 cycles (FIG. 17). In order to investigate the role of the strain on the interface between the resistor and the trace, we compared a printed trace with no chip, with a chip-integrated sample for repeated cycles of 30-50-100-200-400% strain (FIG. 18). Only when reaching to 400% strain there is a noticeable difference between the two samples.

Toluene vapor exposure, is a room temperature procedure that contributes to a homogeneous reaction of the elastic substrate and the ink and thus a uniform softening on all surfaces.

Figure 1:
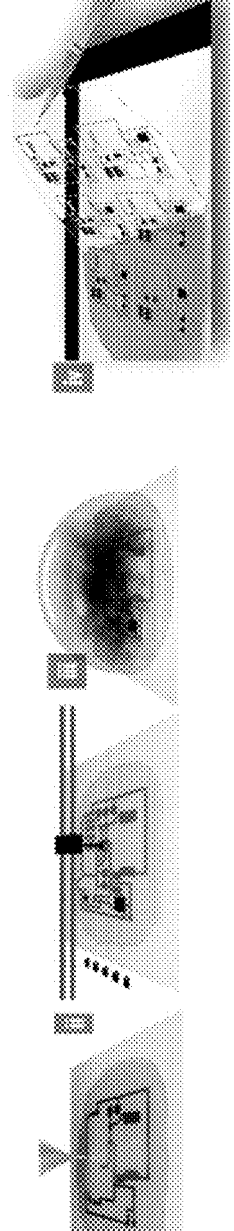
Figure 2:
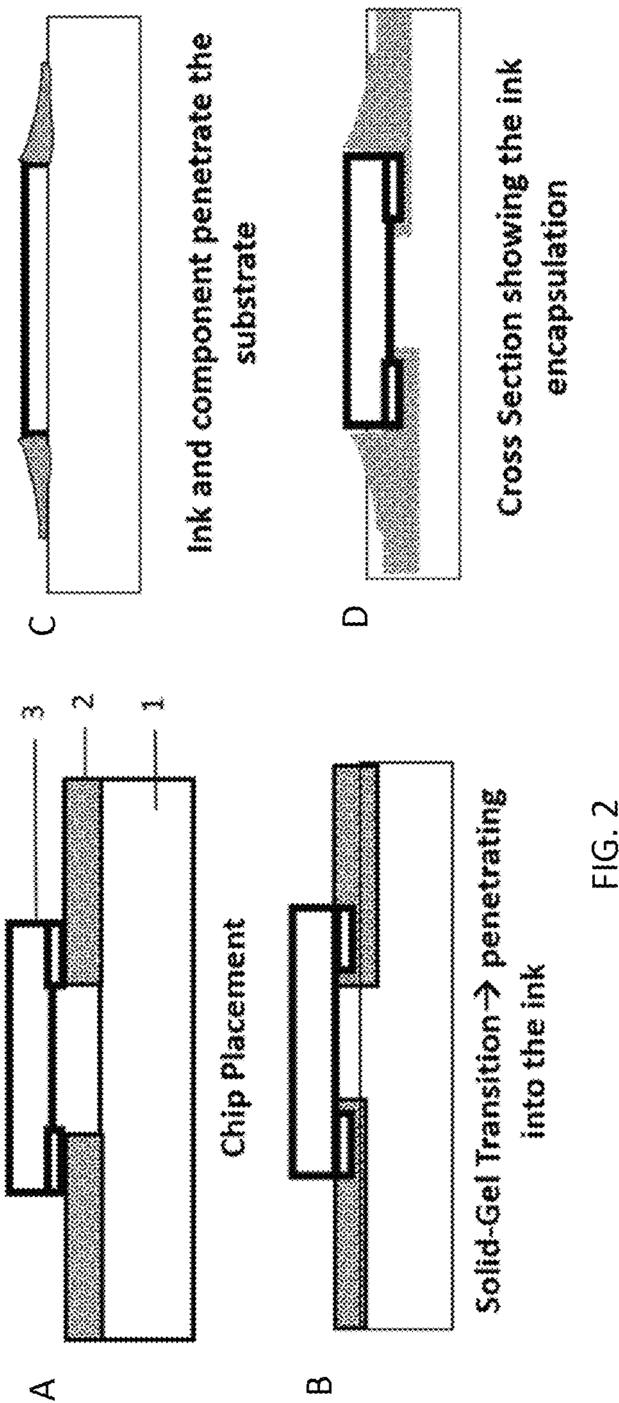

The following pertains to the disclosed self-coating application. During the exposure, an interesting self-coating over the printed inks occurs, which eliminates the need for the cumbersome posterior coating. The self-coating of the ink is visible in FIGS. 2, 13 and 19. A thin layer of the polymer covers the ink, thus eliminating the need for an additional encapsulation step. This polymer layer not only protects the ink from corrosion and oxidization, it is as well very resilient film which protects the ink from scratch. The thickness of this film depends on the exposure time and vapor intensity. In one test, we showed that it is even possible to coat the microchips. We used a thicker substrate (3 mm thick SIS substrate), over which we placed a LED, and left it in the vapor exposure chamber. The circuit is fully coated, including the LED (FIG. 20).

The following pertains to the disclosed substrate healing application. The vapor exposure as well is used for some other interesting improvements in the circuit. Prior to the printing, the substrate that is prepared from the pre-polymer or a polymer solution can be subject to the vapor exposure, which smoothens the surface of the substrate and heals some of micro cracks of the substrate. If not healed, these cracks serve as starting points for propagation of the larger cracks. Scanning Electron Microscopy analysis of images from the SIS substrate (FIG. 21) shows well the healing of the micro cracks and smoothening of the substrate after the treatment. Other imperfections that seem to be undissolved SIS powder on the surface of the substrate, disappeared after the vapor exposure. Electromechanical characterization showed that applying this treatment prior to the printing the ink can increase the maximum strain tolerance prior to electrical failure from around 950% to around 1200% (FIG. 22). Note that these are only printed traces without integrated chip.

Figure 23:
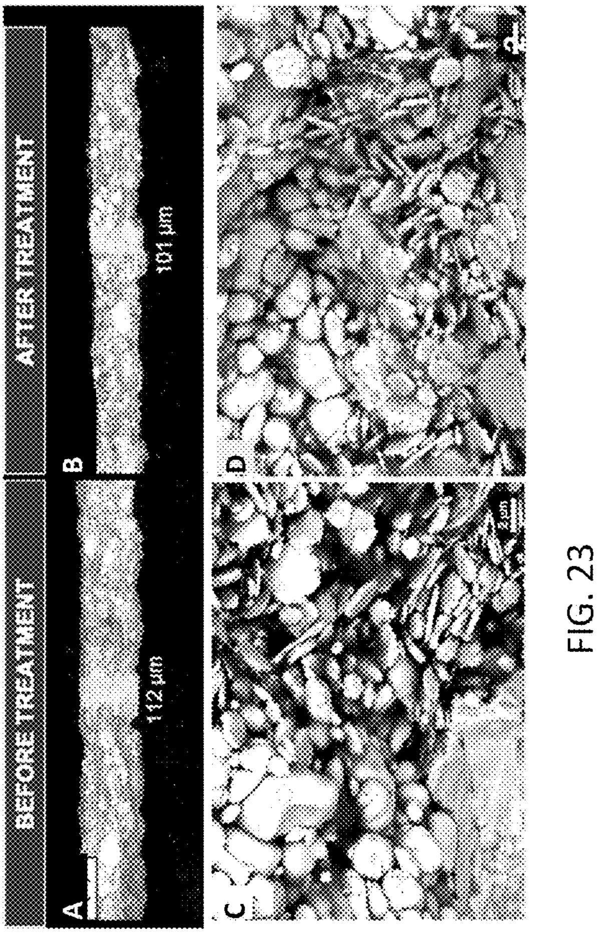

The following pertains to the disclosed conductivity improvement application. Vapor exposure as well enhances the conductivity of the ink by two times (FIG. 23). This is due to the improved percolation of the Ag—In—Ga microstructure. The vapor exposure softens the SIS matrix in the ink, which provides an opportunity for the Ag flakes and other microparticles to reorganize themselves, resulting in a better 3D percolating network, and a higher conductivity. The vapor exposure reduces the overall thickness of the printed ink by around 10% (FIG. 23), and results in a denser 3D percolating network, resulting in an over 2× improvement in the electrical conductivity (FIG. 24). Higher magnification images (FIG. 23C, 23D) show as well that after the vapor exposure the Ag flakes, AgIn2, and EGaIn droplets are entangled together in a more compact form, when compared to the sample prior to the treatment. The dark color "blurred" spaces visible in FIG. 23 are SIS polymer. After the vapor exposure, they are reduced and more uniformly distributed in the ink. This seems to be due to the fact that during the vapor exposure, as the SIS turns into a gel, micro-particles move downward due to the gravity, thus pushing some of the SIS out of the ink. This results in a better 3D percolating network, thus improved conductivity. It is however interesting that the ink fully keeps it integrity inside the SIS gel.

Figure 25:
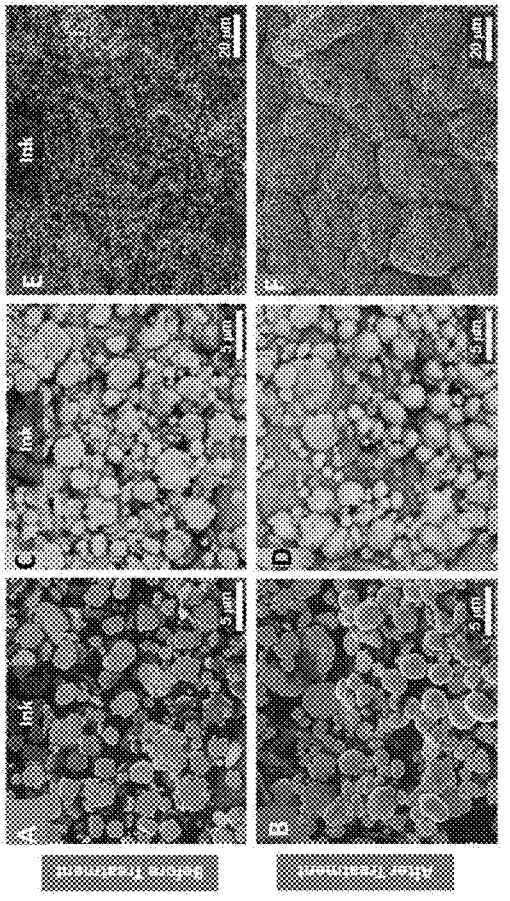

The following pertains to the disclosed microscopy analysis on the ink before and after vapor exposure. FIG. 25 compares the microstructure of the ink before and after the vapor exposure. FIGS. 25A and 25B show secondary electrons (SE) analysis of a sample before and after treatment, and FIGS. 25E and 25D show the backscattered electrons (BSE) analysis of the same. The Ag flakes are visible on all samples. We also observe some microspheres (<5 μm), which are newly formed. These are $AgIn_2$ (See FIG. 26 EDS-X Ray Spectroscopy analysis). These microspheres are formed during the ink mixing and are present on both non treated and treated samples. But it seems that for the treated samples they appear more on the top surface, as can be seen in the SE images (FIGS. 25A and 25B). In contrast, Ga—In droplets are only visible on the BSE images, meaning that they are mostly buried below Ag micro flakes and $AgIn_2$ microparticles. We then prepared a thinner layer of the sample by spray coating of the ink over textile. FIGS. 25E, and 25F show the microstructure of the samples before and after the vapor treatment. Here, the morphology of the ink after treatment is clearly more compact, and relatively large raspberry shape clusters (>20 μm) can be seen. On either case, the formation of these $AgIn_2$ particles change the composition of initial Ga—In mixed into the ink. For instance, if an eutectic Ga—In is utilized in the ink formulation, after mixing it is not anymore Eutectic.

Figure 27:
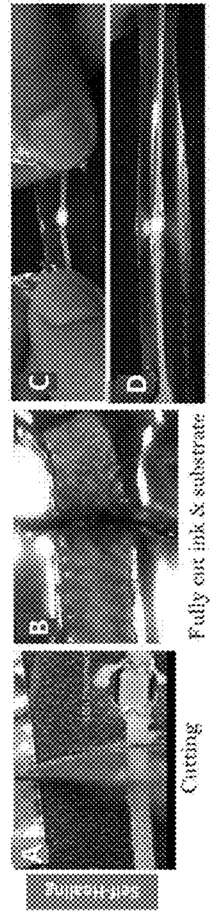

The following pertains to the disclosed circuit repair application through Healing. The vapor exposure can be as well used to repair circuits that are cut. FIG. 27 shows a circuit over which a through cut was made on the printed circuit and the substrate. The vapor exposure was able to heal the circuit so effectively, that not only it restored the electrical functionality, but it could be as well stretched again.

The following pertains to the disclosed circuit transfer application. The vapor exposure can be used as well to transfer the printed circuit into other surfaces, such as textile to fabricate complex e-textiles for wearable biomonitoring (FIG. 28). This allows to extend the application of these printed circuits to scalable fabrication of e-textile, and in-mold electronics and structural electronics. The circuit is simply placed above the substrate and exposed to the solvent vapor. When the substrate goes to the gel state, it wets the fibers of the textile and gets fully integrated into the host fibers. An example of temperature monitoring mask is shown in FIG. 28.

The following pertains to disclosed application of recycling electronics. As the substrate, and the conductive trace, contain a polymer with reversible solid-gel transition, and the bonding of the microchips to the circuit is made using such polymer, the produced circuit can be recycled by dissolving the circuit in the polymer solvent. In this way all silicon chips, can be restored. Further processing of the remaining solution can be used to as well restore the metals in the ink, such as Gallium, Indium, and Silver.

In an exemplary embodiment, the ink is prepared by dissolving SIS in Toluene (15 wt % SIS) until a clear solution is obtained. For each 5 g of BCP solution, 6.2 g of Ag flakes and 15 g of EGaIn are added and mixed using a planetary mixer (2000 rpm). A higher weight ratio between liquid metal and silver flakes improves the electrical and electromechanical properties of the ink, as long as a higher liquid metal weight ratio still ensures printability and non-smearing characteristics. Generally, the weight ratio between liquid metal and silver flakes of 0.6-2.5 provides satisfactory results.

Figure 30:
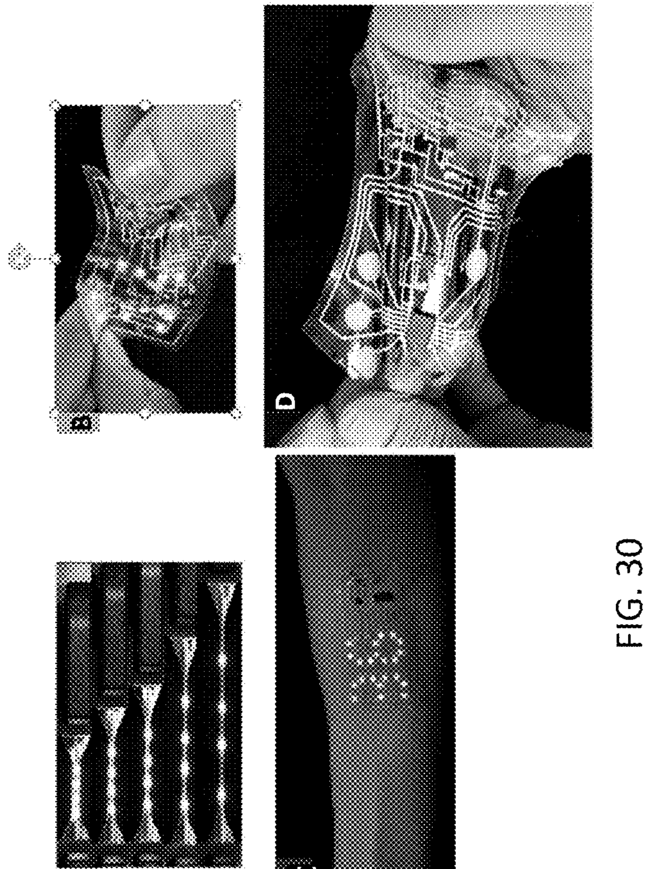

The following pertains to disclosed examples of integrated circuits. FIG. 29, shows an example of a complex circuit that was produced by laser patterning, using a fiber laser, for a temperature measurement patch with Bluetooth communication. This circuit integrates a microprocessor, a temperature sensor, and a Bluetooth module, and is able to communicate the body temperature to a smart phone. FIG. 30 shows other examples of microchip integrated printed and stretchable circuits, including an example of a circuit with integrated LEDs under strain (FIG. 30A), a temperature measurement patch with LED display (FIG. 30B, 30C), and an example of a chip-integrated multi-layer circuit (30D). The vapor exposure method showed to be very effective to attach ICs with different size packaging. FIG. 31, shows an example of a battery-less printed NFC circuit, and FIG. 32 shows an example of another battery-less printed circuit with RFID antenna for energy harvesting.

The term "comprising" whenever used in this document is intended to indicate the presence of stated features, integers, steps, components, but not to preclude the presence or addition of one or more other features, integers, steps, components or groups thereof.

It will be appreciated by those of ordinary skill in the art that unless otherwise indicated herein, the particular sequence of steps described is illustrative only and can be varied without departing from the disclosure. Thus, unless otherwise stated the steps described are so unordered meaning that, when possible, the steps can be performed in any convenient or desirable order.

Furthermore, it is to be understood that the invention encompasses all variations, combinations, and permutations in which one or more limitations, elements, clauses, descriptive terms, etc., from one or more of the claims or from relevant portions of the description is introduced into another claim. For example, any claim that is dependent on another claim can be modified to include one or more limitations found in any other claim that is dependent on the same base claim.

The disclosure should not be seen in any way restricted to the embodiments described and a person with ordinary skill in the art will foresee many possibilities to modifications thereof. The above described embodiments are combinable. The following claims further set out particular embodiments of the disclosure.

ABBREVIATIONS USED

Gauge Factor (GF); Eutectic Gallium-Indium (EGaIn); Liquid Metal (LM); Styrene-isoprene (SIS); Block co-polymers (BCP); Poly(vinyl alcohol) (PVA); Light-Emitting Diode (LED); Nanoparticle (NP); Microparticle (μP); Scanning electronic microscopy (SEM); Energy dispersive X-ray spectroscopy (EDS); Backscattered electron (BSE)

REFERENCES

[1] D. G. Marques, P. A. Lopes, A. T. de Almeida, Carmel Majidi, M. Tavakoli, *Lab a Chip* (*In Press*. 2019, 19, 897.

[2] S. Choi, S. I. Han, D. Kim, T. Hyeon, D. H. Kim, *Chem. Soc. Rev.* 2019, 48, 1566.

[3] M. Tavakoli, R. Rocha, L. Osorio, M. Almeida, A. De Almeida, V. Ramachandran, A. Tabatabai, T. Lu, C. Majidi, *J. Micromechanics Microengineering* 2017, 27, DOI 10.1088/1361-6439/aa5ab1.

[4] S. Zhu, J.-H. So, R. Mays, S. Desai, W. R. Barnes, B. Pourdeyhimi, M. D. Dickey, *Adv. Funct. Mater.* 2013, 23, 2308.

[5] B. A. Gozen, A. Tabatabai, O. B. Ozdoganlar, C. Majidi, *Adv. Mater.* 2014, DOI 10.1002/adma.201400502.

[6] A. Fassler, C. Majidi, *Lab Chip* 2013, 13, 4442.

[7] S. H. Jeong, K. Hjort, Z. Wu, *Sci. Rep.* 2015, DOI 10.1038/srep08419.

[8] R. K. Kramer, C. Majidi, R. J. Wood, *Adv. Funct. Mater.* 2013, DOI 10.1002/adfm.201203589.

[9] M. R. Khan, J. Bell, M. D. Dickey, *Adv. Mater. Interfaces* 2016, DOI 10.1002/admi.201600546.

[10] Y. Zheng, Z. Z. He, J. Yang, J. Liu, *Sci. Rep.* 2014, 4, 1.

[11] C. Ladd, J. H. So, J. Muth, M. D. Dickey, *Adv. Mater.* 2013, 25, 5081.

[12] T. Lu, E. J. Markvicka, Y. Jin, C. Majidi, *ACS Appl. Mater. Interfaces* 2017, 9, 22055.

[13] T. Lu, L. Finkenauer, J. Wissman, C. Majidi, 2014, 3351.

[14] C. Pan, K. Kumar, J. Li, E. J. Markvicka, P. R. Herman, C. Majidi, *Adv. Mater.* 2018, 30, 1.

[15] D. G. Marques, P. A. Lopes, A. T. de Almeida, Carmel Majidi, M. Tavakoli, *Lab a Chip* (*In Press*. 2019.

[16] A. Cook, D. P. Parekh, C. Ladd, G. Kotwal, L. Panich, M. Durstock, M. D. Dickey, C. E. Tabor, *Adv. Eng. Mater.* 2019, 21, 1900400.

[17] A. Tabatabai, A. Fassler, C. Usiak, C. Majidi, *Langmuir* 2013, 29, 6194.

[18] G. Li, X. Wu, D. W. Lee, *Lab Chip* 2016, DOI 10.1039/c6lc00046k.

[19] R. Guo, J. Tang, S. Dong, J. Lin, H. Wang, J. Liu, W. Rao, *Adv. Mater. Technol.* 2018, 3, DOI 10.1002/admt.201800265.

[20] G. Li, D. W. Lee, *Lab Chip* 2017, 17, 3415.

[21] R. Guo, S. Yao, X. Sun, J. Liu, *Sci. China Mater.* 2019, DOI 10.1007/s40843-018-9400-2.

[22] M. A. H. Khondoker, D. Sameoto, *Smart Mater. Struct.* 2016, DOI 10.1088/0964-1726/25/9/093001.

[23] D. F. Fernandes, C. Majidi, M. Tavakoli, *J. Mater. Chem. C* 2019, 7, 14035.

[24] K. B. Ozutemiz, J. Wissman, O. B. Ozdoganlar, C. Majidi, *Adv. Mater. Interfaces* 2018, 1701596, 1.

[25] B. Zhang, Q. Dong, C. E. Korman, Z. Li, M. E. Zaghloul, *Sci. Rep.* 2013, DOI 10.1038/srep01098.

[26] S. H. Jeong, A. Hagman, K. Hjort, M. Jobs, J. Sundqvist, Z. Wu, *Lab Chip* 2012, DOI 10.1039/c2lc40628d.

[27] T. Lu, E. J. Markvicka, Y. Jin, C. Majidi, *ACS Appl. Mater. Interfaces* 2017, 9, 22055.

[28] T. Lu, J. Wissman, C. Majidi, *ACS Appl. Mater. Interfaces* 2015, 7, 26923.

[29] N. Kazem, T. Hellebrekers, C. Majidi, *Adv. Mater.* 2017, 29, DOI 10.1002/adma.201605985.

The invention claimed is:

1. A method for obtaining a flexible circuit with a solid-state electric or electronic component, the method comprising:

arranging an electric circuit with a conductive flexible polymer-based ink over a polymeric substrate in the solid state, wherein one or both polymers in the ink and the substrate are reversible solid-gel phase transition polymers;

placing the solid-state electric or electronic component over the substrate and over the electric circuit;

applying an external stimulus that results in a solid to gel transition of the polymeric substrate, or polymer-based ink, or both polymeric substrate and polymer-based ink, to soften same, such that the solid-state electric or electronic component penetrates the softened polymer-based ink or polymeric substrate, establishing an electrical contact of the solid-state electric or electronic component with the circuit.

2. The method according to claim 1 subsequently comprising the step of removing the external stimulus that results in a gel to solid transition of the polymeric substrate and ink, such that the ink and the component are lodged in the substrate.

3. The method according to claim 1 further comprising the steps of:

dissolving or softening the circuit with a solvent;

recovering the circuit component or components; and optionally processing the dissolved solution to recover metal or metals present in order to recover at least one component of the circuit.

4. The method according to claim 1, further comprising dissolving the circuit with a solvent and processing a solution resulting from the dissolved circuit to recover ink ingredients.

5. The method according to claim 1, wherein the polymer is selected to have adhesive properties during its gel state.

6. The method according to claim 1, for repairing said circuit when the circuit has been subjected to an interruption, comprising the step of repeating the application of the external stimulus that results in a solid-gel transition of the polymeric substrate and polymer-based ink, such that the polymer-based ink electrically reconnects said interruption.

7. The method according to claim 1 wherein the flexible circuit is stretchable.

8. The method according to claim 1, wherein the substrate and the ink are selected such that solid-gel transition is reversible for at least a predetermined number of transitions.

9. The method according claim 8, wherein the polymer of the ink, the substrate, or both is a styrenic block copolymers (SBC) selected from the group consisting of: styrene-isoprene block copolymers (SIS), Styrene-Ethylene-Butadiene-Styrene (SEBS), Styrene-Ethylene-Propylene-Styrene—SEPS, or the polymer is selected from the group of polyurethanes, Thermoplastic polyurethane (TPU), Fluorine rubbers, silicones, polycarbonates, Poly (ethylene terephthalate)-foil s (PET), Poly (ethylene naphthalate)-(PEN), Polyimine, and Poly (imide)-foil (PI).

10. The method according to claim 1, wherein the external stimulus for the solid-gel transition is exposure to vapour or airborne droplets of a material that causes the solid-gel transition in the substrate and the ink, or the external stimulus is selected from the group consisting of: heat, Ph, light, and a magnetic field, or the external stimulus for the solid-gel transition is exposure to solvent vapour or airborne droplets, and the solvent is a polymer-acceptable solvent, or the external stimulus for the solid-gel transition is exposure to toluene.

11. The method according to claim 1, wherein the ink comprises particles of a metal, a liquid metal and a polymer, in which the liquid metal is a metal that is liquid at the room temperature, defined as temperature above 20° C.

12. The method according to claim 11, wherein the liquid metal is Gallium, Indium, or mixtures thereof and the ink comprises Ag flakes in a SIS elastomer, as well as Gallium-Indium, forming an Ag—In—Ga—SIS composite, and the Gallium-Indium is eutectic Gallium-Indium (EGaIn), forming a SIS—Ag-EGaIn ink.

13. The method according to claim 1, further comprising causing the ink to penetrate into the softened substrate such that the ink in the obtained circuit is non-smearing to the touch.

14. A circuit according to claim 1, wherein the circuit is comprised by a gelatine-like non-smearing structure formed by the electric circuit and the polymeric substrate.

15. A method for obtaining a flexible circuit, the method comprising:

arranging an electric circuit with a conductive flexible polymer-based ink over a polymeric substrate in the solid state, wherein both polymers in the ink and the substrate are reversible solid-gel phase transition polymers; and applying an external stimulus that results in a solid to gel transition of the polymeric substrate and polymer-based ink to soften same, such that the polymer-based ink penetrates into the softened polymeric substrate for obtaining the flexible circuit.

16. The method according to claim 15, wherein the solid to gel transition of the substrate comprises softening the substrate and the ink for a period of time, such that the gel substrate climbs over the electronic component and surrounds said component, due to capillary action.

17. The method according to claim 15, wherein the ink has a higher density than the substrate such that the ink, when penetrating the substrate, descends into the substrate under the effect of gravity and is encapsulated within the substrate.

18. The method according to claim 15, further comprising:

placing the ink and the electronic component in relation to the substrate such that the ink and the electronic component penetrate into the softened substrate under the effect of gravity, or applying a mechanical force over the electronic component such that the ink and the electronic component penetrate into the softened substrate.

19. A process for producing a flexible circuit using a conductive polymer-based ink over a polymeric substrate, comprising:

printing, depositing or patterning the conductive polymer-based ink over the polymeric substrate in the solid state, wherein one or both polymers in the ink and the substrate comprise:

a reversible solid-gel phase transition polymer;

particles of a conductive material; and a liquid metal, thereafter applying an external stimulus for causing a polymer-gel transition, whereby either the electrical conductivity or mechanical deformability or both are improved.

20. The process according to claim 19, wherein the liquid metal comprises Gallium, Indium, or mixtures thereof, and wherein the polymer comprises an elastomer.

21. The process according to the claim 19, wherein the particles of a conductive material are metal particles or metal-coated particles.

22. The process according to claim 21, wherein the ink contains an intermetallic combination of the liquid metal with the metal or metal-coated particles.

23. The process according to claim 19, wherein the ink comprises a solvent suitable to prevent polymerisation of the ink before ink deposition or before solvent evaporation caused by ink deposition.

24. The process according to claim 19, wherein the particles of a conductive material are carbon-based particles.

25. The process according to claim 19, wherein the ink comprises Ag flakes in a SIS elastomer, as well as Gallium-Indium, forming an Ag—In—Ga—SIS composite.

26. The process according to claim 19, wherein the ink comprises Nickel or Ferrite or Copper or Zinc particles, or silver coated particles, in a SIS elastomer, as well as Gallium-Indium, forming a particle-In—Ga—SIS composite.

27. The process according to claim 19, wherein the improvement in conductivity is at least two times or wherein the improvement in mechanical deformability is sufficient to heal micro-cracks in the polymer substrate.

* * * * *